United States Patent
Kaneoka et al.

(10) Patent No.: US 9,455,264 B2
(45) Date of Patent: Sep. 27, 2016

(54) SEMICONDUCTOR DEVICE AND MANUFACTURING METHOD THEREOF

(71) Applicant: RENESAS ELECTRONICS CORPORATION, Kawasaki-shi, Kanagawa (JP)

(72) Inventors: Tatsunori Kaneoka, Kawasaki (JP); Takaaki Kawahara, Kawasaki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/789,770

(22) Filed: Jul. 1, 2015

(65) Prior Publication Data

US 2015/0303205 A1    Oct. 22, 2015

Related U.S. Application Data

(62) Division of application No. 13/783,268, filed on Mar. 2, 2013, now Pat. No. 9,105,739.

(30) Foreign Application Priority Data

Mar. 13, 2012   (JP) ................................. 2012-055693

(51) Int. Cl.
*H01L 27/115* (2006.01)
*H01L 21/02* (2006.01)
(Continued)

(52) U.S. Cl.
CPC ....... *H01L 27/1157* (2013.01); *H01L 21/0217* (2013.01); *H01L 21/02164* (2013.01); *H01L 21/2855* (2013.01); *H01L 21/28273* (2013.01); *H01L 21/28282* (2013.01); *H01L 21/28556* (2013.01); *H01L 21/28568* (2013.01);
(Continued)

(58) Field of Classification Search
None
See application file for complete search history.

(56) References Cited

U.S. PATENT DOCUMENTS 6,054,349 A    4/2000   Nakajima et al.
6,936,884 B2   8/2005   Chae et al.
(Continued)

FOREIGN PATENT DOCUMENTS

JP    11-195780      7/1999
JP    2000-022005 A  1/2000
(Continued)

OTHER PUBLICATIONS

Ishida et al., "Characterization of Charge Traps in Metal-Oxide-Nitride-Oxide-Semiconductor (MONOS) Structures for Embedded Flash Memories", IEEE 44th Annual International Reliability Physics Symposium, San Jose, 2006, pp. 516-522.
(Continued)

*Primary Examiner* — Khaja Ahmad
(74) *Attorney, Agent, or Firm* — Shapiro, Gabor and Rosenberger, PLLC

(57) ABSTRACT

A semiconductor device with a nonvolatile memory is provided which has improved electric performance. A memory gate electrode is formed over a semiconductor substrate via an insulating film. The insulating film is an insulating film having a charge storage portion therein, and includes a first silicon oxide film, a silicon nitride film over the first silicon oxide film, and a second silicon oxide film over the silicon nitride film. Metal elements exist between the silicon nitride film and the second silicon oxide film, or in the silicon nitride film at a surface density of $1 \times 10^{13}$ to $2 \times 10^{14}$ atoms/cm$^2$.

9 Claims, 27 Drawing Sheets

(51) Int. Cl.
*H01L 29/40* (2006.01)
*H01L 29/423* (2006.01)
*H01L 21/28* (2006.01)
*H01L 21/285* (2006.01)
*H01L 29/788* (2006.01)
*H01L 29/792* (2006.01)
*H01L 29/66* (2006.01)
*H01L 21/3213* (2006.01)
*H01L 29/51* (2006.01)

(52) U.S. Cl.
CPC ....... *H01L21/32133* (2013.01); *H01L 29/401* (2013.01); *H01L 29/4234* (2013.01); *H01L 29/42324* (2013.01); *H01L 29/42344* (2013.01); *H01L 29/42348* (2013.01); *H01L 29/511* (2013.01); *H01L 29/518* (2013.01); *H01L 29/66825* (2013.01); *H01L 29/66833* (2013.01); *H01L 29/7881* (2013.01); *H01L 29/792* (2013.01); *H01L 27/11521* (2013.01); *H01L 27/11568* (2013.01)

(56) References Cited

U.S. PATENT DOCUMENTS

| | | | |
|---|---|---|---|
| 7,045,848 B2 | 5/2006 | Shukuri | |
| 7,148,106 B2 | 12/2006 | Joo et al. | |
| 7,250,653 B2 | 7/2007 | Kim et al. | |
| 8,269,268 B2 | 9/2012 | Huo et al. | |
| 8,436,417 B2 | 5/2013 | Shimizu et al. | |
| 2004/0070026 A1 | 4/2004 | Kamigaki et al. | |
| 2005/0122775 A1* | 6/2005 | Koyanagi | B82Y 10/00 365/185.11 |
| 2006/0284236 A1* | 12/2006 | Bhattacharyya | B82Y 10/00 257/314 |
| 2008/0246078 A1* | 10/2008 | Huo | B82Y 10/00 257/324 |
| 2008/0290401 A1* | 11/2008 | Yasui | G11C 16/0425 257/324 |
| 2009/0096014 A1 | 4/2009 | Choi et al. | |
| 2010/0109074 A1 | 5/2010 | Seol et al. | |
| 2011/0062511 A1 | 3/2011 | Ramaswamy et al. | |
| 2011/0175156 A1 | 7/2011 | Okuyama | |
| 2012/0235223 A1* | 9/2012 | Ohba | B82Y 10/00 257/324 |

FOREIGN PATENT DOCUMENTS

| | | |
|---|---|---|
| JP | 2003-309193 A | 10/2003 |
| JP | 2004-134796 | 4/2004 |
| JP | 2004-349705 | 12/2004 |
| JP | 2005-079186 | 3/2005 |
| JP | 2006-066896 | 3/2006 |
| JP | 2008-306190 A | 12/2008 |
| JP | 2010-161154 A | 7/2010 |
| JP | 2011-018432 | 1/2011 |
| JP | 2011-146612 A | 7/2011 |
| JP | 2011-205046 | 10/2011 |

OTHER PUBLICATIONS

Office Action for related Japanese Patent Application No. 2012-055693, mailed Mar. 3, 2015.

Office Action from Japanese Patent Application No. 2012-055693, mailed Sep. 8, 2015.

* cited by examiner

FIG. 4

| | OPERATION MECHANISM WRITING/ERASING | WRITING OPERATION VOLTAGE (V) Vmg/Vs/Vcg/Vd/Vb | ERASING OPERATION VOLTAGE (V) Vmg/Vs/Vcg/Vd/Vb | READING OPERATION VOLTAGE (V) Vmg/Vs/Vcg/Vd/Vb |
|---|---|---|---|---|
| A | SSI(WRITING)/BTBT(ERASING) | 10/5/1/0.5/0 | -6/6/0/open/0 | 0/0/1.5/1.5/0 |
| B | SSI(WRITING)/FN(ERASING) | 10/5/1/0.5/0 | 12/0/0/0/0 | 0/0/1.5/1.5/0 |
| C | FN(WRITING)/BTBT(ERASING) | -12/0/0/0/0 | -6/6/0/open/0 | 0/0/1.5/1.5/0 |
| D | FN(WRITING)/FN(ERASING) | -12/0/0/0/0 | 12/0/0/0/0 | 0/0/1.5/1.5/0 |

SEMICONDUCTOR DEVICE AND MANUFACTURING METHOD THEREOF

CROSS-REFERENCE TO RELATED APPLICATIONS

The disclosure of Japanese Patent Application No. 2012-055693 filed on Mar. 13, 2012 including the specification, drawings and abstract is incorporated herein by reference in its entirety.

BACKGROUND

The present invention relates to semiconductor devices and manufacturing methods thereof, and more specifically, to a technique effectively applied to a semiconductor device with a nonvolatile memory and a manufacturing method thereof.

An electrically erasable and programmable read only memory (EEPROM) is widely used as an electrically writable and erasable nonvolatile semiconductor storage device. Such a storage device (memory), typified by a flash memory widely used at present, includes a conductive floating gate electrode or trapping insulating film surrounded by an oxide film, under a gate electrode of a MISFET. The storage device is designed to identify the state of charges stored in the floating gate or trapping insulating film as storage information, and to read the information as a threshold of a transistor. The trapping insulating film is an insulating film that can store the charges, and includes a silicon nitride film, by way of example. The storage device is further designed to shift a threshold of the MISFET by trapping and emission of the charges into and from a charge storage region to act as a storage element. The flash memory includes, for example, a split gate cell using a metal-oxide-nitride-oxide-semiconductor (MONOS) film. This kind of memory has the following advantages by using a silicon nitride film for the charge storage region. For example, such a memory has excellent reliability of data hold because of discontinuously storing the charges as compared to the conductive floating gate film. And, the excellent reliability of the date hold enables the reduction in thickness of oxide films located above and under the silicon nitride film, and can decrease the voltage for writing and erasing operations.

Japanese Unexamined Patent Publication No. 2003-309193 (Patent Document 1) describes a technique regarding a MONOS memory.

Japanese Unexamined Patent Publication No. 2000-22005 (Patent Document 2) discloses a technique regarding a nanocrystal floating gate.

Japanese Unexamined Patent Publication No. 2010-161154 (Patent Document 3) discloses a technique regarding silicon nano-dots.

Japanese Unexamined Patent Publication No. 2011-146612 (Patent Document 4) discloses a technique regarding a MONOS memory.

Non-Patent Document 1 discloses a technique regarding a charge trapping in a MONOS structure.

RELATED ART DOCUMENTS

Patent Documents

[Patent Document 1]
Japanese Unexamined Patent Publication No. 2003-309193
[Patent Document 2]
Japanese Unexamined Patent Publication No. 2000-22005
[Patent Document 3]
Japanese Unexamined Patent Publication No. 2010-161154
[Patent Document 3]
Japanese Unexamined Patent Publication No. 2011-146612

Non-Patent Documents

[Non-Patent Document 1]
"Characterization of Charge Traps in Metal-Oxide-Nitride-Oxide-Semiconductor (MONOS) Structures for Embedded Flash Memories" T. Ishida, et al.: IRPS 2006 (IEEE International Reliability Physics Symposium) p. 516

SUMMARY

Related-art split gate nonvolatile memories have a laminated gate insulating film, for example, which is comprised of a lamination of oxide-nitride-oxide (ONO) film including a silicon oxide film, a silicon nitride film, and another silicon oxide film.

In recent years, the nonvolatile memories have been required to improve electric performance.

Accordingly, it is an object of the present invention to provide a technique that can improve the electric performance of a semiconductor device.

The above and other problems to be solved by the present invention, and new features of the present invention will become apparent from the description and accompanying drawings of the present specification.

The outline of representative embodiments of the invention disclosed in the present application will be briefly described below.

In a semiconductor device according to a representative embodiment, a gate insulating film of a memory transistor includes a first silicon oxide film, a silicon nitride film over the first silicon oxide film, and a second oxide film over the silicon nitride film. Metal elements exist between the silicon nitride film and the second silicon oxide film, or in the silicon nitride film at a surface density of $1\times10^{13}$ to $2\times10^{14}$ atoms/cm$^2$.

A manufacturing method of a semiconductor device according to the representative embodiment involves forming a gate insulating film of a memory transistor which includes a first silicon oxide film, a silicon nitride film over the first silicon oxide film, a second oxide film over the silicon nitride film, and metal elements introduced into between the silicon nitride film and the second silicon oxide film, or in the silicon nitride film at a surface density of $1\times10^{13}$ to $2\times10^{14}$ atoms/cm$^2$.

The effects made by the representative embodiments of the invention disclosed in the present application will be briefly described as follows.

The representative embodiments of the invention can improve the electric performance of the semiconductor device.

BRIEF DESCRIPTION OF THE DRAWINGS

FIG. 4 is a table showing an example of application conditions of voltages to each component of a selection memory cell in "writing", "erasing", and "reading";

DETAILED DESCRIPTION

Figure 1:
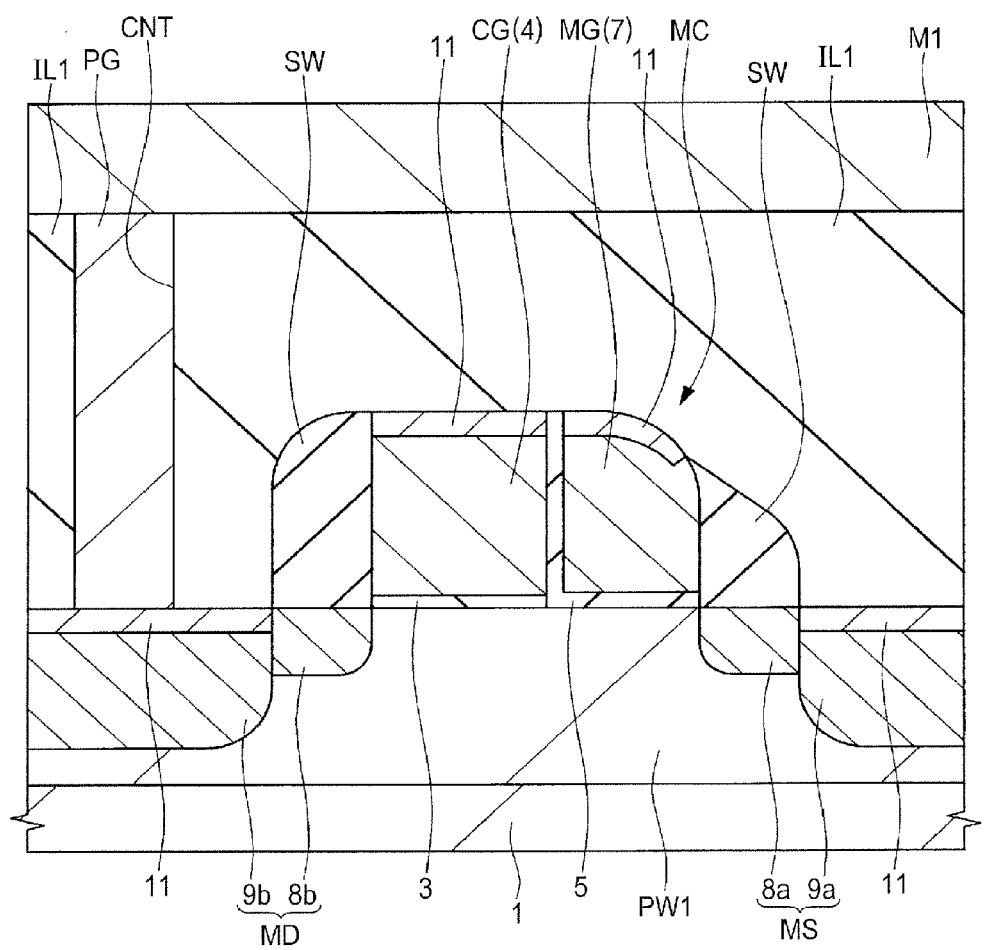
FIG. 1 is a cross-sectional view of a main part of a semiconductor device according to one embodiment of the invention.

In the present application, the following preferred embodiments may be described below by being divided into a plurality of sections or the embodiments for convenience, if necessary, which are not independent from each other unless otherwise specified. One of the sections may be a modified example, the details, or additional explanation of a part or all of the other. Even when referring to a specific numerical number (number, numerical value, quantity, range, and the like) of elements in the following embodiments, the elements may not be limited to the specific number, and may be greater than, or less than the specific numerical number, unless otherwise specified, and except when limited to the specific number in theory. Further, obviously, in the following embodiments, the components (including element steps or the like) are not necessarily essential unless otherwise specified, and except when apparently considered to be essential in principle. Likewise, when referring to the shape and positional relationship of the components in the following embodiments, the shape and positional relationship can include those substantially similar or approximating to the shape or the like described herein, unless otherwise specified, and except when considered not to be so in principle. The same can go for the above numerical value and range.

Preferred embodiments of the invention will be described below in detail based on the accompanying drawings. In each drawing for explaining the embodiments, parts having the same function are indicated by the same numeral character, and its description will not be repeated in principle. In the following embodiments, the description of the same or similar parts will not be repeated in principle, except when necessary.

In the accompanying drawings used in the embodiments, even a cross-sectional view may omit hatching in some cases for easy understanding. And, even the plan view can be often indicated with hatching for easy understanding.

First Embodiment

A semiconductor device defined in this embodiment and the following other embodiments is a semiconductor device with a nonvolatile memory (nonvolatile storage element, flash memory, nonvolatile semiconductor storage device). In this embodiment and the other embodiments below, the nonvolatile memory will be described by taking as a basic example, a memory cell including an n-channel MISFET (metal insulator semiconductor field effect transistor). The polarity (polarity of applied voltage or carrier in writing, erasing, and reading) specified in this embodiment and the other embodiments below is used to explain the operation of the memory cell including the n-channel MISFET as a basic component. In contrast, in explaining the operation of a memory cell including a p-channel MISFET as the basic component, the polarity of the applied voltages and carriers can be reversed to obtain the same operation in principle.

The semiconductor device of this embodiment will be described below with reference to the accompanying drawings.

Figure 2:
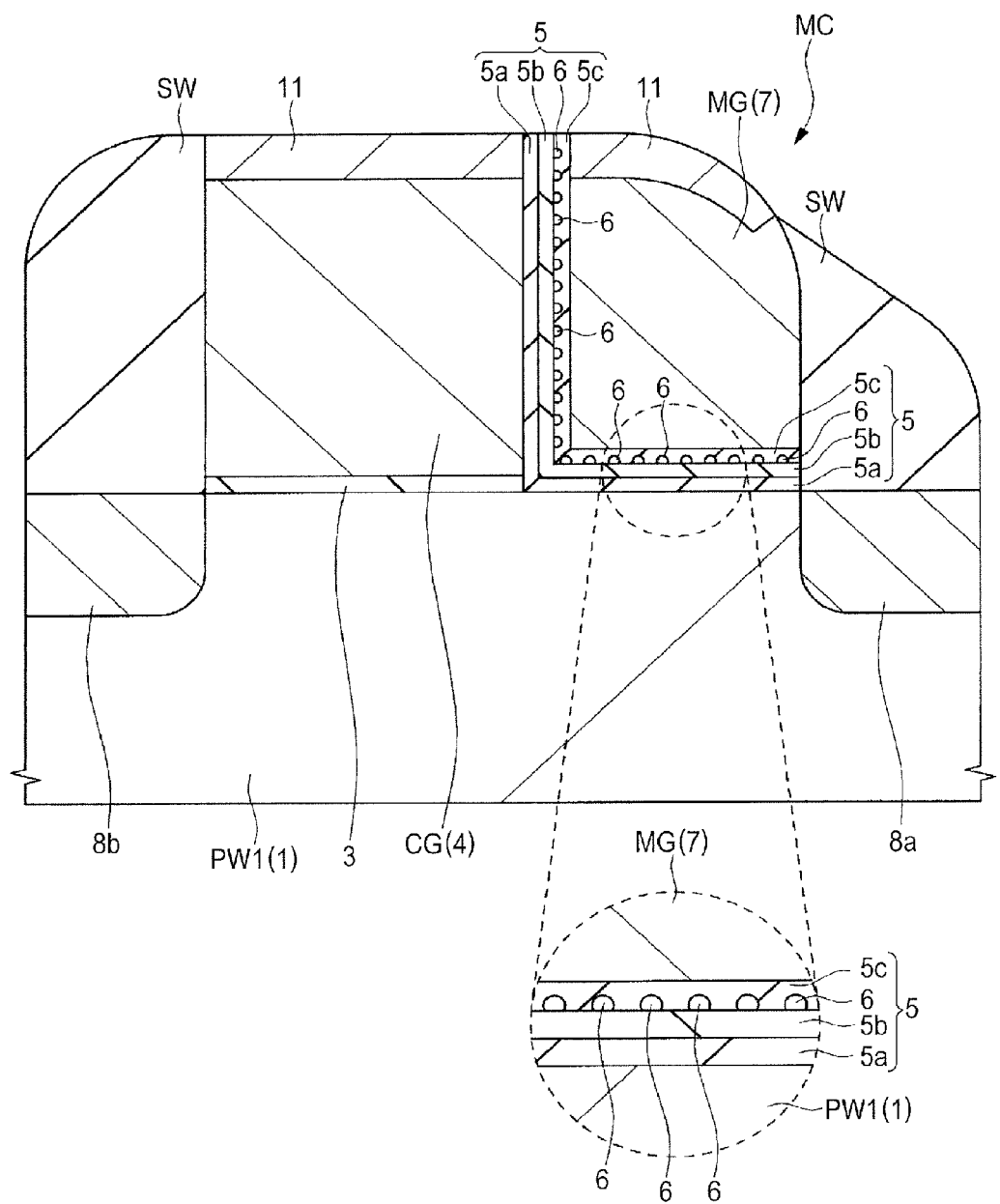
FIG. 2 is a partial enlarged cross-sectional view of a part shown in FIG. 1.
Figure 3:
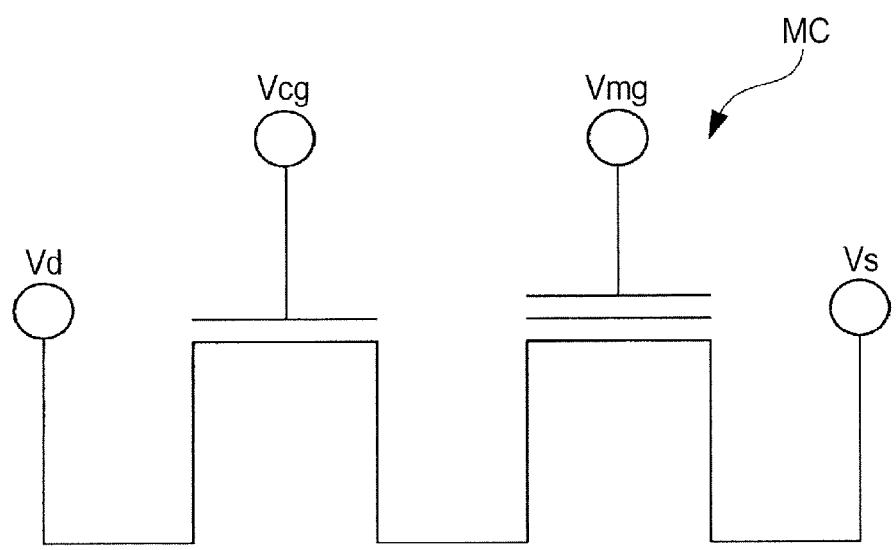
FIG. 3 is an equivalent circuit diagram of a memory cell.

FIG. 1 shows a cross-sectional view of a main part of a semiconductor device of this embodiment. The semiconductor device of this embodiment is a semiconductor device with a nonvolatile memory. FIG. 1 shows a cross-sectional view of the main part of a memory cell region of the nonvolatile memory. FIG. 2 is a partial enlarged cross-sectional view (main-part cross-sectional view) of a memory cell MC in the semiconductor device of this embodiment, showing an enlarged part of FIG. 1. FIG. 3 shows an equivalent circuit diagram of the memory cell MC. For easy understanding, FIG. 2 omits the illustration of an interlayer insulating film 22 shown in FIG. 1.

As shown in FIG. 1, a semiconductor substrate (semiconductor wafer) 1 formed of p-type single crystal silicon having a specific resistance of about 1 to 10 Ωcm is provided with an element isolation region for isolating elements (not shown and corresponding to an element isolation region 2 to be described later). A p-type well PW1 is formed in an active region isolated (defined) by the element isolation region. In the p-type well PW1 of the memory cell region, the memory cell MC as the nonvolatile memory including a memory transistor and a control transistor (selection transistor) shown in FIG. 1 is formed. Actually, a plurality of memory cells MC are formed in array in the respective memory cell regions. FIG. 1 shows the cross section of one memory cell MC among them. The memory cell regions are electrically isolated from other regions by the element isolation regions.

As shown in FIGS. 1 to 3, the memory cell MC of the nonvolatile memory in the semiconductor device of this embodiment is a split gate memory cell including two MISFETs coupled together, namely, a control transistor (selection transistor) with a control gate electrode (selection gate electrode) CG, and a memory transistor with a memory gate electrode (gate electrode for memory) MG.

The MISFET (metal insulator semiconductor field effect transistor) including the memory gate electrode MG and a gate insulating film with a charge storage portion (charge storage layer) is hereinafter referred to as the memory transistor (transistor for storage). Another MISFET including the control gate electrode CG and a gate insulating film is hereinafter referred to as the control transistor (selection transistor, transistor for memory cell selection). Thus, the memory gate electrode MG is a gate electrode of the memory transistor, and the control gate electrode CG is a gate electrode of the control transistor. The control gate electrode CG and the memory gate electrode MG are gate electrodes included in the nonvolatile memory (memory cell thereof).

Now, the structure of the memory cell MC will be specifically described.

As shown in FIGS. 1 and 2, the memory cell MC of the nonvolatile memory includes n-type semiconductor regions MS and MD for source and drain formed in the p-type well PW1 of the semiconductor substrate 1, the control gate electrode CG formed over the semiconductor substrate 1 (p-type well PW1), and the memory gate electrode MG formed adjacent to the control gate electrode CG over the semiconductor substrate 1 (p-type well PW1). The memory cell MC of the nonvolatile memory includes an insulating film (gate insulating film) 3 formed between the control gate electrode CG and the semiconductor substrate 1 (p-type well PW1), and an insulating film 5 formed between the memory gate electrode MG and the semiconductor substrate 1 (p-type well PW1) and between the memory gar electrode MG and the control gate electrode CG.

The control gate electrode CG and the memory gate electrode MG are arranged in parallel, extending along the main surface of the semiconductor substrate 1 with the insulating film 5 intervening in between opposed sides (sidewalls) of both electrodes. The extending direction of the control gate electrode CG and the memory gate electrode MG is the direction perpendicular to the paper surface of FIG. 1. The control gate electrode CG and the memory gate electrode MG are formed over the semiconductor substrate 1 (p-type well PW1) between the semiconductor region MD and the semiconductor region MS via the insulating films 3 and 5 (specifically, the control gate electrode CG is formed via the insulating film 3, and the memory gate electrode MG is formed via the insulating film 5), respectively. The memory gate electrode MG is positioned on the semiconductor region MS side, and the control gate electrode CG is positioned on the semiconductor region MD side.

The control gate electrode CG and the memory gate electrode MG are adjacent to each other with the insulating film 5 intervening therebetween. The memory gate electrode MG is formed in a sidewall-spacer manner over the side (sidewall) of the control gate electrode CG via the insulating film 5. The insulating film 5 extends over both the region between the memory gate electrode MG and the semiconductor substrate 1 (p-type well PW1) and the region between the memory gate electrode MG and the control gate electrode CG.

The insulating film 3 (that is, insulating film 3 under the control gate electrode CG) formed between the control gate electrode CG and the semiconductor substrate 1 (p-type well PW1) serves as the gate insulating film of the control transistor. The insulating film 5 (that is, insulating film 5 under the memory gate electrode MG) formed between the memory gate electrode MG and the semiconductor substrate 1 (p-type well PW1) serves as the gate insulating film of the memory transistor (gate insulating film including the charge storage portion therein).

The insulating film 3 can be formed of, for example, a silicon oxide film or silicon oxynitride film. The insulating film 3 can be formed using a metal oxide film having a higher dielectric constant than that of the silicon nitride film, such as a hafnium oxide film, an aluminum oxide (alumina) film, or a tantalum oxide film, in addition to the above silicon oxide film and the silicon oxynitride film.

The insulating film 5 is comprised of a laminated film including a silicon oxide film (oxide film) 5a, a silicon nitride film (nitride film) 5b over the silicon oxide film 5a, and a silicon oxide film (oxide film) 5c over the silicon nitride film 5b. Metal elements M are introduced into between the silicon nitride film 5b and the silicon oxide film 5c at a surface density of $1 \times 10^{13}$ to $2 \times 10^{14}$ atoms/cm$^2$. Specifically, a plurality of metal dots 6 comprised of the metal elements M are disposed (formed) between the silicon nitride film 5b and the silicon oxide film 5c in the insulating film 5. The metal element introduced into the insulating film 5 is indicated by the metal element M. The metal element M is preferably titanium (Ti), nickel (Ni), tungsten (W), or tantalum (Ta), and more preferably titanium (Ti).

That is, the insulating film 5 is a laminated film comprised of the silicon nitride film 5a, the silicon nitride film 5b formed over the silicon oxide film 5a, the metal dots 6 formed over the silicon nitride film 5b, and the silicon oxide film 5c formed over the silicon nitride film 5b to cover the metal dots 6. That is, in the insulating film 5, the metal dots 6 are dispersed over the upper surface of the silicon nitride film 5b. And, the silicon oxide film 5c is formed over the silicon nitride film 5b to cover the metal dots 6.

In this embodiment, in the insulating film 5, the metal elements M are introduced at a surface density of $1\times10^{13}$ to $2\times10^{14}$ atoms/cm$^2$ between the silicon nitride film 5b and the silicon oxide film 5c. Specifically, the metal dots 6 comprised of the metal elements M are disposed (formed). The surface density of the metal element M between the silicon nitride film 5b and the silicon oxide film 5c is very small, specifically, $2\times10^{14}$ atoms/cm$^2$ or less. For this reason, the metal atoms (atoms of the metal element M) are not arranged continuously in a planar manner to form a continuous film (layer). That is, about several metal atoms (atoms of metal element M) are gathered into an individual metal dot 6. A plurality of metal dots 6 are dispersed over the surface (upper surface) of the silicon nitride film 5b. The metal dots 6 are spaced apart from each other.

For easy understanding, FIG. 1 shows the laminated film comprised of the silicon oxide film 5a, the silicon nitride film 5b, the metal dots 6, and the silicon oxide film 5c, simply as the insulating film 5. Actually, as shown in FIG. 2, the insulating film 5 is a laminated film comprised of the silicon oxide film 5a, the silicon nitride film 5b, the metal dots 6, and the silicon oxide film 5c.

The insulating film 5 extending over the region between the memory gate electrode MG and the semiconductor substrate 1 (p-type well PW1) and over the region between the memory gate electrode MG and the control gate electrode CG can be regarded as a gate insulating film (laminated gate insulating films, lamination of gate insulating films). The insulating film 5 between the memory gate electrode MG and the semiconductor substrate 1 (p-type well PW1) serves as a gate insulating film of the memory transistor. The insulating film 5 between the memory gate electrode MG and the control gate electrode CG serves as an insulating film for insulating (electrically isolating) a region between the memory gate electrode MG and the control gate electrode CG.

The silicon nitride film 5b and the metal dots 6 of the insulating film 5 has a function of storing charges, and can serve as a charge storage portion. That is, the silicon nitride film 5b is a trapping insulating film (charge storage layer) formed in the insulating film 5, and the metal dots 6 are trapping metal dots (dot-like charge storage portion) formed in the insulating film 5. Thus, the insulating film 5 can be regarded as an insulating film including the charge storage portion (silicon nitride film 5b and the metal dots 6) therein.

The silicon oxide film 5c and the silicon oxide film 5a positioned above and under the silicon nitride film 5b and the metal dots 6 can serve as a charge blocking layer (charge blocking film, charge trapping layer). The silicon nitride film 5b and the metal dots 6 are sandwiched between the silicon nitride film 5c and the silicon oxide film 5a, which can store the charges in the silicon nitride film 5b and the metal dots 6.

The semiconductor region MS is a semiconductor region serving as one of a source region and a drain region, and the semiconductor region MD is a semiconductor region serving as the other of the source region and the drain region. The semiconductor region MS is the semiconductor region serving as the source region, and the semiconductor region MD is the semiconductor region serving as the drain region. Each of the semiconductor regions MS and MD is comprised of the semiconductor region (n-type impurity diffusion layer) into which n-type impurities are introduced, and thus has a lightly doped drain (LDD) structure. That is, the semiconductor region MS for the source includes an n$^-$-type semiconductor region 8a, and an n$^+$-type semiconductor region 9a having a higher impurity concentration than that of the n$^-$-type semiconductor region 8a. The semiconductor region MD for the drain includes an n$^-$-type semiconductor region 8b, and an n$^+$-type semiconductor region 9b having a higher impurity concentration than that of the n$^-$-type semiconductor region 8b. The n$^+$-type semiconductor region 9a has a more junction depth and a higher impurity concentration than those of the n$^-$-type semiconductor region 8a. The n$^+$-type semiconductor region 9b has a more junction depth and a higher impurity concentration than those of the n$^-$-type semiconductor region 8b.

Sidewall spacers (sidewalls, sidewall insulating films) SW comprised of an insulating film (silicon oxide film, silicon nitride film, or a lamination thereof) are formed over the sidewalls of the memory gate electrode MG and the control gate electrode CG (sidewall thereof not adjacent to each other). That is, the sidewall spacers SW are formed over the sidewall (side) of the memory gate electrode MG opposite to the side thereof adjacent to the control gate electrode CG via the insulating film 5, and over the sidewall (side) of the control gate electrode CG opposite to the side thereof adjacent to the memory gate electrode MG via the insulating film 5.

The n$^-$-type semiconductor region 8a of the source is formed in self-alignment with the sidewall of the memory gate electrode MG. The n$^+$-type semiconductor region 9a is formed in self-alignment with the side of the sidewall spacer SW formed over the sidewall of the memory gate electrode MG (side of the spacer SW opposite to the side in contact with the memory gate electrode MG). Thus, the low-concentration n$^-$-type semiconductor region 8a is formed under (below) the sidewall spacer SW over the sidewall of the memory gate electrode MG. The high-concentration n$^+$-type semiconductor region 9a is formed outside the low-concentration n$^-$-type semiconductor region 8a. Thus, the low-concentration n-type semiconductor region 8a is formed adjacent to a channel region of the memory transistor, and the high-concentration n$^+$-type semiconductor region 9a is formed in contact with (adjacent to) the low-concentration n$^-$-type semiconductor region 8a, and spaced apart from the channel region of the memory transistor by the n$^-$-type semiconductor region 8a.

The n$^-$-type semiconductor region 8b of the drain is formed in self-alignment with the sidewall of the control gate electrode CG. The n$^+$-type semiconductor region 9b of the drain is formed in self-alignment with the side of the sidewall spacer SW located over the sidewall of the control gate electrode CG (side of the spacer SW opposite to the side in contact with the control gate electrode CG). Thus, the low-concentration n$^-$-type semiconductor region 8b is formed under (below) the sidewall spacer SW located over the sidewall of the control gate electrode CG, and the high-concentration n$^+$-type semiconductor region 9b is formed outside the low-concentration n$^-$-type semiconductor region 8b. Thus, the low-concentration n-type semiconductor region 8b is formed adjacent to a channel region of the control transistor. And, the high-concentration n$^+$-type semiconductor region 9b is formed in contact with (adjacent to) the low-concentration n⁻-type semiconductor region 8b, and spaced apart from the channel region of the control transistor by the n⁻-type semiconductor region 8b.

The channel region of the memory transistor is formed under the insulating film 5 located under the memory gate electrode MG. The channel region of the control transistor is formed under the insulating film 3 located under the control gate electrode CG. In the channel formation region of the control transistor under the insulating film 3 located under the control gate electrode CG, a semiconductor region for adjustment of a threshold (p-type semiconductor region or n-type semiconductor region) of the control transistor is formed if necessary. In the channel formation region of the memory transistor under the insulating film 5 located under the memory gate electrode MG, a semiconductor region for adjustment of a threshold (p-type semiconductor region or n-type semiconductor region) of the memory transistor is formed if necessary.

The control gate electrode CG is comprised of a conductor (conductive film), for example, a silicon film 4 comprised of an n-type polysilicon film (polycrystalline silicon film with n-type impurities introduced thereinto, or doped polysilicon film). Specifically, the control gate electrode CG is comprised of the silicon film 4 patterned.

The memory gate electrode MG is comprised of a conductor (conductive film), for example, a silicon film 7 comprised of an n-type polysilicon film (polycrystalline silicon film with n-type impurities introduced thereinto, or doped polysilicon film). Specifically, the silicon film 7 (for example, polycrystalline silicon film with n-type impurities introduced thereinto) is formed over the semiconductor substrate 1 to cover the control gate electrode CG, and subjected to anisotropic etching (etched back) to leave the silicon film 7 over the sidewall of the control gate electrode CG via the insulating film 5. Thus, the memory gate electrode MG is formed over one sidewall of the control gate electrode CG in a sidewall spacer manner via the insulating film 5.

A metal silicide layer (metal silicide film) 11 is formed by the Salicide (self aligned silicide) technique over the upper part (upper surface) of the memory gate electrode MG (silicon film 7 included therein), over the upper part (upper surface) of the control gate electrode CG (silicon film 4 included therein), and over the upper part (upper surface, or front surface) of each of the n⁺-type semiconductor regions 9a and 9b. A metal silicide layer 11 is comprised of, for example, a cobalt silicide layer, a nickel silicide layer, or a platinum-added nickel silicide layer. The metal silicide layer 11 can decrease a diffusion resistance or a contact resistance. The combination of the silicon film 4 included in the control gate electrode CG and the metal silicide layer 11 formed thereover can also be regarded as the control gate electrode CG. Further, the combination of the silicon film 7 included in the memory gate electrode MG and the metal silicide layer 11 formed thereover can also be regarded as the memory gate electrode MG. In order to prevent the short circuit between the memory gate electrode MG and the control gate electrode CG as much as possible, the metal silicide layer 11 may not be formed over one or both of the memory gate electrode MG and the control gate electrode CG.

An interlayer insulating film IL1 is formed as an insulating film over the semiconductor substrate 1 to cover the control gate electrode CG, the memory gate electrode MG, and the sidewall spacers SW. The interlayer insulating film IL1 is comprised of a single film comprised of a silicon oxide film, or a laminated film including a silicon nitride film and a silicon oxide film formed over the silicon nitride film more thickly than the silicon nitride film. The interlayer insulating film IL1 has the upper surface thereof flattened.

Contact holes (openings, or through holes) CNT are formed in the interlayer insulating film IL1. In each contact hole CNT, a conductive plug PG is embedded as a conductive portion (conductor for connection).

The plug PC is comprised of a thin barrier conductive film formed at the bottom and sidewall (side) of the contact hole CNT, and a main conductive film formed over the barrier conductive film to fill the contact hole CNT therewith. For easy understanding, FIG. 1 illustrates integration of the barrier conductive film and the main conductive film included in the plug PG. The barrier conductive film included in the plug PG can be comprised of, for example, a titanium film, a titanium nitride film, or a laminated film thereof. The main conductive film included in the plug PG can be a tungsten film.

Parts of the contact holes CNT and the plugs PG embedded therein are located over any one of the n⁺-type semiconductor regions 9a and 9b, the control gate electrode CG, and the memory gate electrode MG, and the like. At the bottom of the contact hole CNT is exposed a part of the main surface of the semiconductor substrate 1, for example, a part of the n⁺-type semiconductor region 9a or 9b (metal silicide layer 11 over the front surface thereof), a part of the control gate electrode CG (metal silicide layer 11 of the front surface thereof), a part of the memory gate electrode MG (metal silicide layer 11 over the front surface thereof), or the like. The exposed part (exposed part located at the bottom of the contact hole CNT) is coupled to the plug PG. As shown in the cross-sectional view of FIG. 1, the part of the n⁺-type semiconductor region 9b (metal silicide layer 11 over the front surface thereof) is exposed at the bottom of the contact hole CNT and electrically coupled to the plug PG filling the contact hole CNT.

A wiring (wiring layer) M1 is formed over the interlayer insulating film IL1 with the plug PG embedded therein. The wiring M1 is, for example, a damascene interconnect (embedded wiring), and embedded in a wiring trench provided in an insulating film (not shown in FIG. 1, but corresponding to an interlayer insulating film IL2 to be described later) formed over the interlayer insulating film IL1. The wiring M1 is electrically coupled to a source region (semiconductor region MS) of the memory transistor, a drain region (semiconductor region MD) of the control transistor, the control gate electrode CG, or the memory gate electrode MG via the plug PG. FIG. 1 shows by way of example, the wiring M1 electrically coupled to the drain region of the control transistor (semiconductor region MD) via the plug PG.

Other wirings and insulating films are also formed as an upper layer over the wiring M1, but the illustration and description thereof will be omitted below. The wiring M1 and the upper layer wiring located thereover are not limited to the damascene interconnect (embedded wiring), and can be formed by patterning a conductive film for wiring, and can be, for example, a tungsten wiring or aluminum wiring.

FIG. 4 is a table showing an example of application conditions of voltages to each component of the selection memory cell in "writing", "erasing", and "reading" in this embodiment. The table of FIG. 4 shows a voltage Vmg applied to the memory gate electrode MG, a voltage Vs applied to the source (semiconductor region MS), a voltage Vcg applied to the control gate electrode CG, a voltage Vd applied to the drain (semiconductor region MD), and a base voltage Vb applied to the p-type well PW1, in the "writing", "erasing", and "reading" in the memory cell (selection memory cell) shown in FIGS. 1 and 2. The table of FIG. 4 describes one preferable example of the voltage application conditions. The invention is not limited thereto, and various changes can be made to these conditions if necessary. In this embodiment, implantation of electrons into the charge storage portion (silicon nitride film 5b and the metal dots 6) of the insulating film 5 of the memory transistor is defined as "writing", and implantation of holes (positive holes) is defined as "erasing".

In the table shown in FIG. 4, the column A corresponds to the case where the writing method is the SSI mechanism and the erasing method is the BTBT mechanism. The column B corresponds to the case where the writing method is the SSI mechanism and the erasing method is the FN mechanism. The column C corresponds to the case where the writing method is the FN mechanism and the erasing method is the BTBT mechanism. The column D corresponds to the case where the writing method is the FN mechanism and the erasing method is the FN mechanism.

The writing mechanisms include a writing mechanism (hot electron implantation writing mechanism) for performing the writing by hot-electron implantation into the source side, which is called the source side injection (SSI) mechanism, and a writing mechanism (tunneling writing mechanism) for performing the writing by fowler nordheim (FN) tunneling called the FN mechanism.

In the writing of the SSI mechanism, for example, the "writing operation voltages" (Vmg=10V, Vs=5V, Vcg=1V, Vd=0.5V, Vb=0V) shown in the column A or B of Table of FIG. 4 are applied to each component of the selection memory cell in writing, and electrons are implanted into the charge storage portion (silicon nitride film 5b and metal dots 6) of the insulating film 5 of the selection memory cell, whereby the writing is performed. At this time, hot electrons are generated in the channel region (between the source and drain) under between two gate electrodes (memory gate electrode MG and control gate electrode CG), and then implanted into the charge storage portion (silicon nitride film 5b and metal dots 6) of the insulating film 5 under the memory gate electrode MG. The implanted hot electrons are trapped in the trapping level of the charge storage portion (silicon nitride film 5b and metal dots 6) in the insulating film 5, which results in an increase in threshold voltage of the memory transistor (causing the writing state).

In the writing of the FN mechanism, for example, the "writing operation voltages" (Vmg=−12V, Vs=0V, Vcg=0V, Vd=0V, Vb=0V) shown in the column C or D of Table of FIG. 4 are applied to each component of the selection memory cell in writing. And electrons are tunneled from the memory gate electrode MG to be implanted into the charge storage portion (silicon nitride film 5b and metal dots 6) of the insulating film 5 of the selection memory cell, whereby the writing is performed. At this time, electrons are transferred from the memory gate MG through the silicon oxide film 5c by FN tunneling (FN tunneling effect) to be implanted into the insulating film 5, and then trapped in the trapping level of the charge storage portion (silicon nitride film 5b and metal dots 6) of the insulating film 5, which results in an increase in threshold voltage of the memory transistor (causing the writing state).

In the writing of the FN mechanism, the writing can also be performed by implanting the electrons tunneling from the semiconductor substrate 1 into the charge storage portion (silicon nitride film 5b and metal dots 6) of the insulating film 5. In this case, the writing operation voltage can be set by reversing the polarity of the "writing operation voltages" shown in the column C or D of the table in FIG. 4.

The erasing methods include an erasing mechanism (hot hole implantation erasing mechanism) for performing the erasing by hot-hole implantation using band-to-band tunneling (BTBT) phenomenon called the BTBT mechanism, and an erasing mechanism (tunneling erasing mechanism) for performing the erasing by fowler nordheim (FN) tunneling called the FN mechanism.

In the erasing of the BTBT mechanism, holes (positive holes) generated by the BTBT (band-to-band tunneling) are implanted into the charge storage portion (silicon nitride film 5b and metal dots 6) of the insulating film 5 to thereby perform the erasing. For example, the "erasing operation voltages" (Vmg=−6V, Vs=6V, Vcg=0V, Vd=open, Vb=0V) shown in the column A or C of the table of FIG. 4 are applied to each component of the selection memory cell in erasing. Thus, the holes (positive holes) are generated by the BTBT (band-to-band tunneling) phenomenon and accelerated by the electric field, so that the holes are implanted into the charge storage portion (silicon nitride film 5b and metal dots 6) of the insulating film 5 of the selection memory cell, which results in a decrease in threshold voltage of the memory transistor (causing the erasing state).

In the erasing of the FN mechanism, for example, the "erasing operation voltages" (Vmg=12V, Vs=0V, Vcg=0V, Vd=0V, Vb=0V) shown in the column B or C of the table of FIG. 4 are applied to each component of the selection memory cell in erasing, and the holes (positive holes) tunneling from the memory gate electrode MG in the selection memory cell are implanted into the charge storage portion (silicon nitride film 5b and metal dots 6) of the insulating film 5, whereby the erasing is performed. At this time, the holes are transferred from the memory gate MG through the silicon oxide film 5c by FN tunneling (FN tunneling effect) to be implanted into the insulating film 5, and then trapped in the trapping level of the charge storage portion (silicon nitride film 5b and metal dots 6) of the insulating film 5, which results in a decrease in threshold voltage of the memory transistor (causing the erasing state).

In the erasing of the FN mechanism, the erasing can also be performed by implanting the holes tunneling from the semiconductor substrate 1 into the charge storage portion (silicon nitride film 5b and metal dots 6) of the insulating film 5. In this case, the erasing operation voltage can be set by reversing the polarity of the "erasing operation voltages" shown in the column B or D of the table in FIG. 4.

In the reading, for example, the "reading operation voltages" shown in the column A, B, C, or D of the table in FIG. 4 are applied to each component of the selection memory cell in reading. The voltage Vmg to be applied to the memory gate electrode MG in the reading is set to an intermediate value between one threshold voltage of the memory transistor in the writing state and another threshold voltage thereof in the erasing state, which can distinguish between the writing state and the erasing state.

Now, a manufacturing method of the semiconductor device in this embodiment will be described below.

Figure 5:
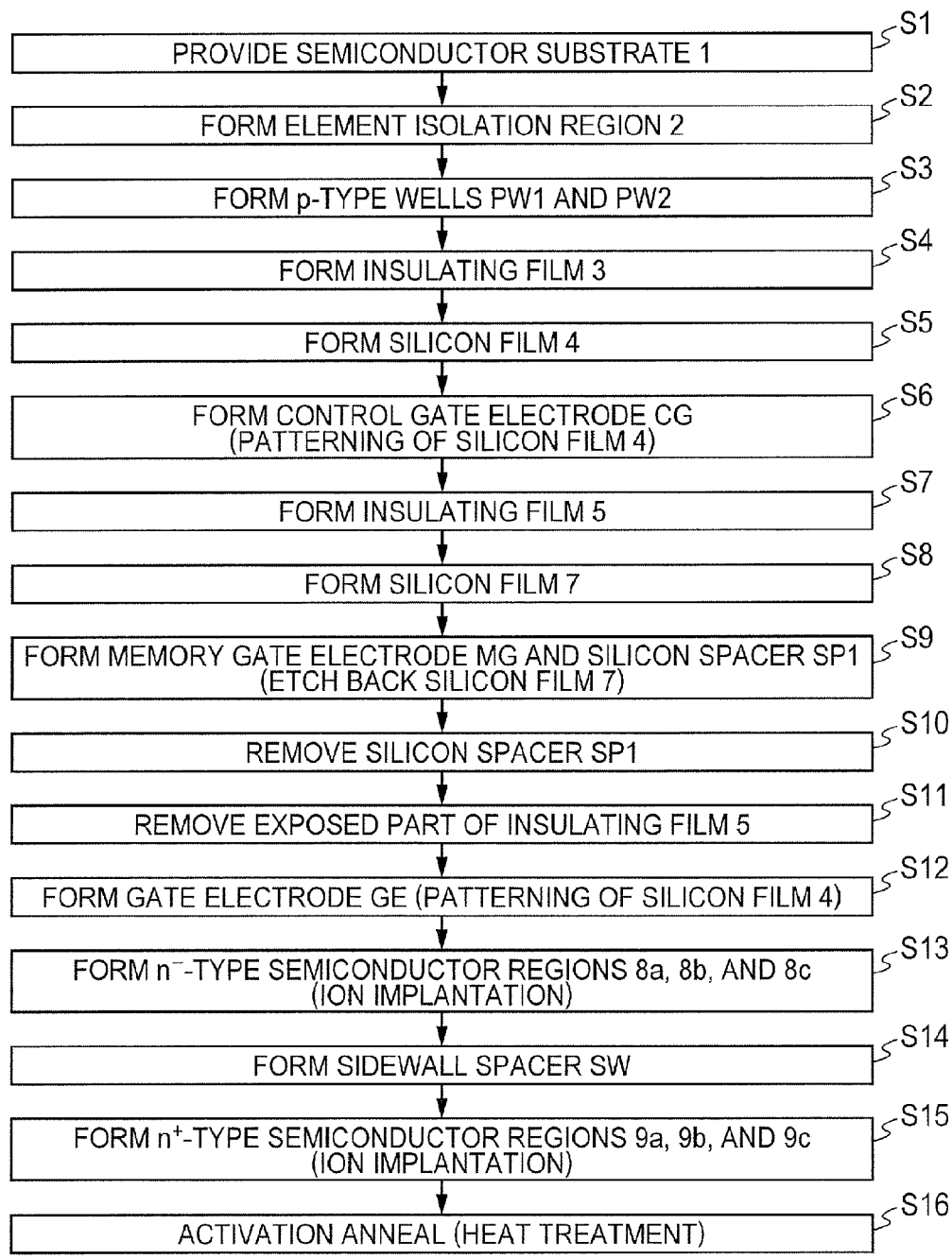
FIG. 5 is a process flowchart showing a part of a manufacturing process of the semiconductor device according to the one embodiment of the invention.
Figure 6:
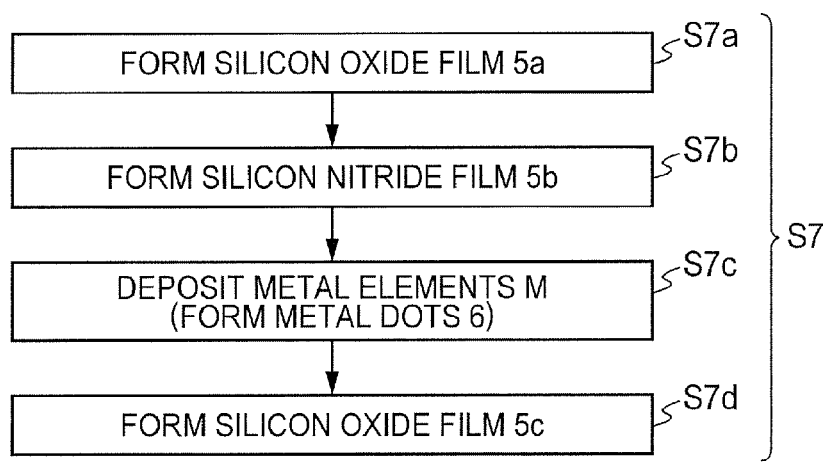
FIG. 6 is a process flowchart showing another part of the manufacturing process of the semiconductor device according to the one embodiment of the invention.

FIGS. 5 and 6 each are a process flowchart showing a part of a manufacturing process of the semiconductor device in this embodiment. FIG. 6 shows the process flowchart showing the details of step S7 (formation process of the insulating film 5) shown in FIG. 5. Each of FIGS. 7 to 28 is a cross-sectional view of a main part of a manufacturing step of the semiconductor device in this embodiment. Among them, in the cross-sectional views of FIGS. 7 to 11 and FIGS. 17 to 28 show main parts of the memory cell region (region where the memory cell MC of the nonvolatile memory is to be formed) 1A, and of the peripheral circuit region (region where a circuit other than the nonvolatile memory is formed) 1B. Referring to these drawings, the memory cell MC is formed in a memory cell region 1A, and the MISFET is formed in the peripheral circuit region 1B. FIGS. 12 to 16 are cross-sectional views of main parts showing the details of the step of FIG. 11 (formation process of the insulating film 5 in step S7), while showing enlarged parts of the memory cell region 1A.

The memory cell region 1A and the peripheral circuit region 1B are formed over the same semiconductor substrate 1. The memory cell region 1A is not necessarily adjacent to the peripheral circuit region 1B. However, for easy understanding, the cross-sectional views of FIGS. 7 to 11 and FIGS. 17 to 28 show the peripheral circuit region 1B adjacent to the memory cell region 1A. The peripheral circuit is a circuit other than the nonvolatile memory. The peripheral circuits include, for example, a processor, such as CPU, a control circuit, a sense amplifier, a column decoder, a low decoder, an input/output circuit, and the like. The MISFET formed in the peripheral circuit region 1B is a MISFET for the peripheral circuit.

In this embodiment, the n-channel MISFET (control transistor and memory transistor) is formed in the memory cell region 1A. Alternatively, a p-channel MISFET (control transistor and memory transistor) whose conductivity type is reversed can be formed in the memory cell region 1A. Likewise, in this embodiment, an n-channel MISFET is formed in the peripheral circuit region 1B. A p-channel MISFET whose conduction type is reversed can also be formed in the peripheral circuit region 1B. Alternatively, a complementary MISFET (CMISFET) or the like can also be formed in the peripheral circuit region 1B.

Figure 7:
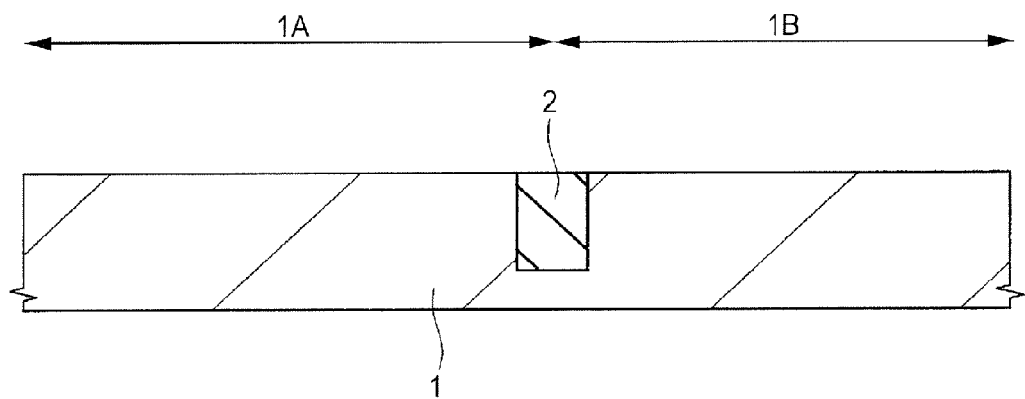
FIG. 7 is a cross-sectional view of a main part of a manufacturing step of the semiconductor device in the one embodiment of the invention.

As shown in FIG. 7, first, a semiconductor substrate (semiconductor wafer) 1 is prepared (provided) (in step S1 shown in FIG. 5). The semiconductor substrate 1 is comprised of, for example, p-type single crystal silicon having a specific resistance of about 1 to 10 Ωcm. Then, element isolation regions (element-element isolation insulating regions) 2 for defining (delimiting) active regions are formed at the main surface of the semiconductor substrate 1 (in step S2 shown in FIG. 5).

The element isolation region 2 is comprised of an insulator, such as silicon oxide, and can be formed, for example, by a shallow trench isolation (STI) method or a local oxidization of silicon (LOCOS) method. For example, after forming the trenches for the element isolation at the main surface of the semiconductor substrate 1, an insulating film comprised of, for example, silicon oxide can be embedded in each trench for the element isolation to thereby form the element isolation regions 2.

Figure 8:
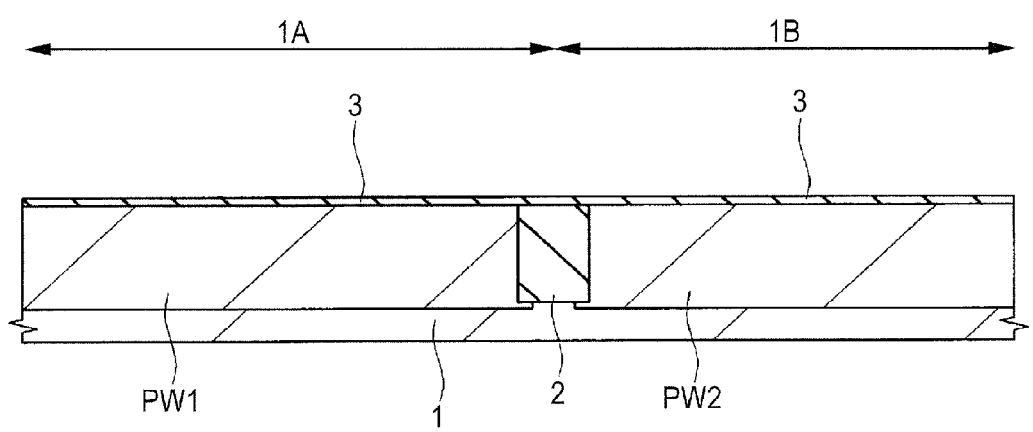
FIG. 8 is a cross-sectional view of a main part of another manufacturing step of the semiconductor device, following the step shown in FIG. 7.

Then, as shown in FIG. 8, the p-type well PW1 is formed in the memory cell region 1A of the semiconductor substrate 1, and the p-type well PW2 is formed in the peripheral circuit region 1B (in step S3 shown in FIG. 5). The p-type wells PW1 and PW2 can be formed, for example, by ion-implanting p-type impurities, such as boron (B), into the semiconductor substrate 1. The p-type wells PW1 and PW2 are formed in a predetermined depth from the main surface of the semiconductor substrate 1.

Then, in order to adjust the threshold voltage of the control transistor to be formed later in the memory cell region 1A, channel doping ion implantation is performed on the front surface (surface layer) of the p-type well PW1 in the memory cell region 1A if necessary. Then, in order to adjust the threshold voltage of the n-channel MISFET to be formed later in the peripheral circuit region 1B, channel doping ion implantation is performed on the front surface (surface layer) of the p-type well PW2 in the peripheral circuit 1B if necessary.

After cleaning the surface of the semiconductor substrate 1 (p-type wells PW1 and PW2) by diluted hydrofluoric acid or the like, the insulating film 3 for the gate insulating film is formed over the main surface (surfaces of the p-type wells PW1 and PW2) of the semiconductor substrate 1 (in step S4 shown in FIG. 5).

The insulating film 3 can be formed of, for example, a thin silicon oxide film or silicon oxynitride film. The thickness (formation thickness) of the insulating film 3 can be, for example, in a range of about 2 to 3 nm. When the insulating film 3 is intended to be formed by thermal oxidation, the insulating film 3 is not formed over the element isolation region 2.

Figure 9:
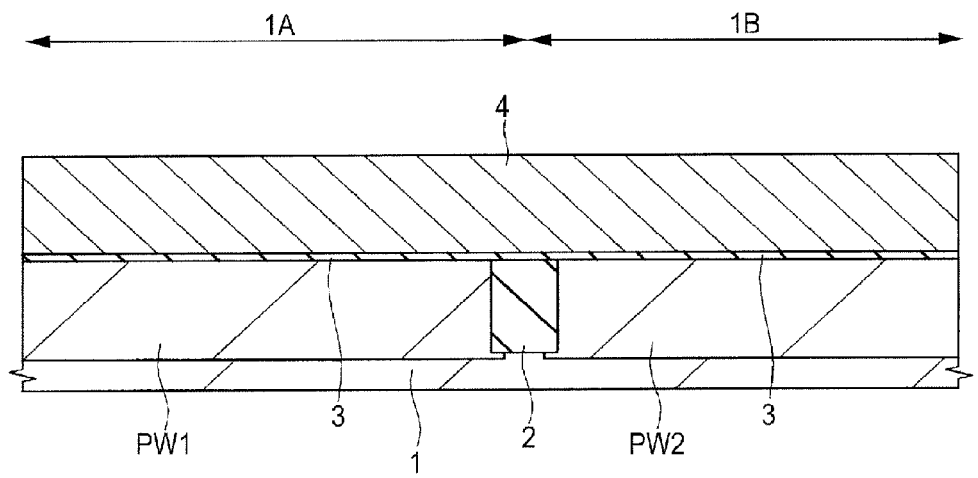
FIG. 9 is a cross-sectional view of a main part of another manufacturing step of the semiconductor device, following the step shown in FIG. 8.

Then, as shown in FIG. 9, the silicon film 4 is formed (deposited) as a conductive film for formation of the control gate electrode CG over the main surface (entire main surface) of the semiconductor substrate 1, that is, over the insulating film 3 in the memory cell region LA and the peripheral circuit region 1B (in step S5 shown in FIG. 5).

The silicon film 4 is comprised of a polycrystalline silicon film (polysilicon film), and can be formed using a chemical vapor deposition (CVD) or the like. The thickness of the silicon film 4 (thickness of the deposited film) can be, for example, in a range of about 50 to 250 nm. In deposition, the silicon film 4 is formed as an amorphous silicon film, and then the amorphous silicon film can be converted into a polycrystalline silicon film by the following heat treatment. The silicon film 4 can become a non-doped silicon film in deposition.

After forming the silicon film 4, a photoresist pattern is formed over the silicon film 4 using a photolithography method (not shown, but the photoresist pattern is formed over the entire peripheral circuit region 1B). N-type impurities are introduced by the ion implantation into the silicon film 4 in the memory cell region 1A using the photoresist pattern as a mask, so that the silicon film 4 in the memory cell region 1A becomes the n-type silicon film 4. That is, the n-type impurities are introduced into the silicon film 4 in the memory cell region 1A, so that the silicon film 4 in the memory cell region 1A becomes the n-type silicon film 4 into which the n-type impurities are introduced. At this time, no n-type impurities are introduced (ion-implanted) into the silicon film 4 in the peripheral circuit region 1B.

Figure 10:
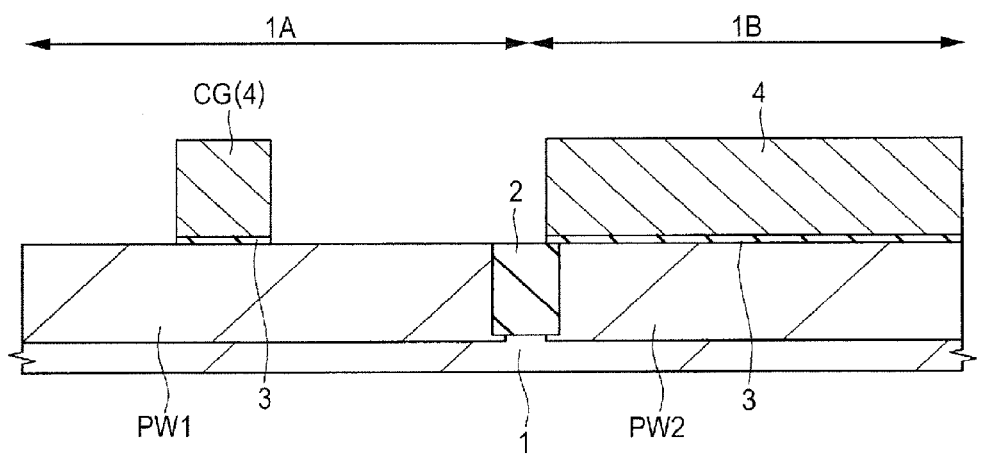
FIG. 10 is a cross-sectional view of a main part of another manufacturing step of the semiconductor device, following the step shown in FIG. 9.

Then, as shown in FIG. 10, the n-type silicon film 4 in the memory cell region 1A is patterned by etching to form the control gate electrode CG (in step S6 shown in FIG. 5). The patterning process in step S6 can be performed, for example, in the following way.

That is, a photoresist pattern is formed over the silicon film 4 by the photolithography (not shown, but the photolithography pattern is formed over the entire peripheral circuit region 1B and a region where the control gate electrode CG is to be formed). Then, the silicon film 4 in the memory cell region 1A is patterned by etching (dry etching) using the photoresist pattern as an etching mask. Then, the photoresist pattern is removed.

In this way, the silicon film 4 is patterned in step S6, so that the control gate electrode CG comprised of the patterned silicon film 4 is formed in the memory cell region 1A as shown in FIG. 10. Since the photoresist pattern is formed over the peripheral circuit region 1B as mentioned above, the silicon film 4 therein is not patterned, and thus remains as it is. In the memory cell region 1A, the insulating film 3 remaining under the control gate electrode CG serves as a gate insulating film of the control transistor. Thus, the control gate electrode CG comprised of the silicon film 4 is formed over the semiconductor substrate 1 (p-type well PW1) via the insulating film 3 as the gate insulating film.

In the memory cell region 1A, a remaining part of the insulating film 3 except for a part of the film 3 covered with the control gate electrode (that is, remaining part of the insulating film 3 other than the part serving as the gate insulating film) can be removed by the dry etching performed in the patterning process in step S6, or by wet etching after the dry etching.

Then, in order to adjust the threshold voltage of the memory transistor to be formed later in the memory cell region 1A, channel doping ion implantation is performed on the surface (surface layer) of the p-type well PW1 in the memory cell region 1A if necessary.

Figure 11:
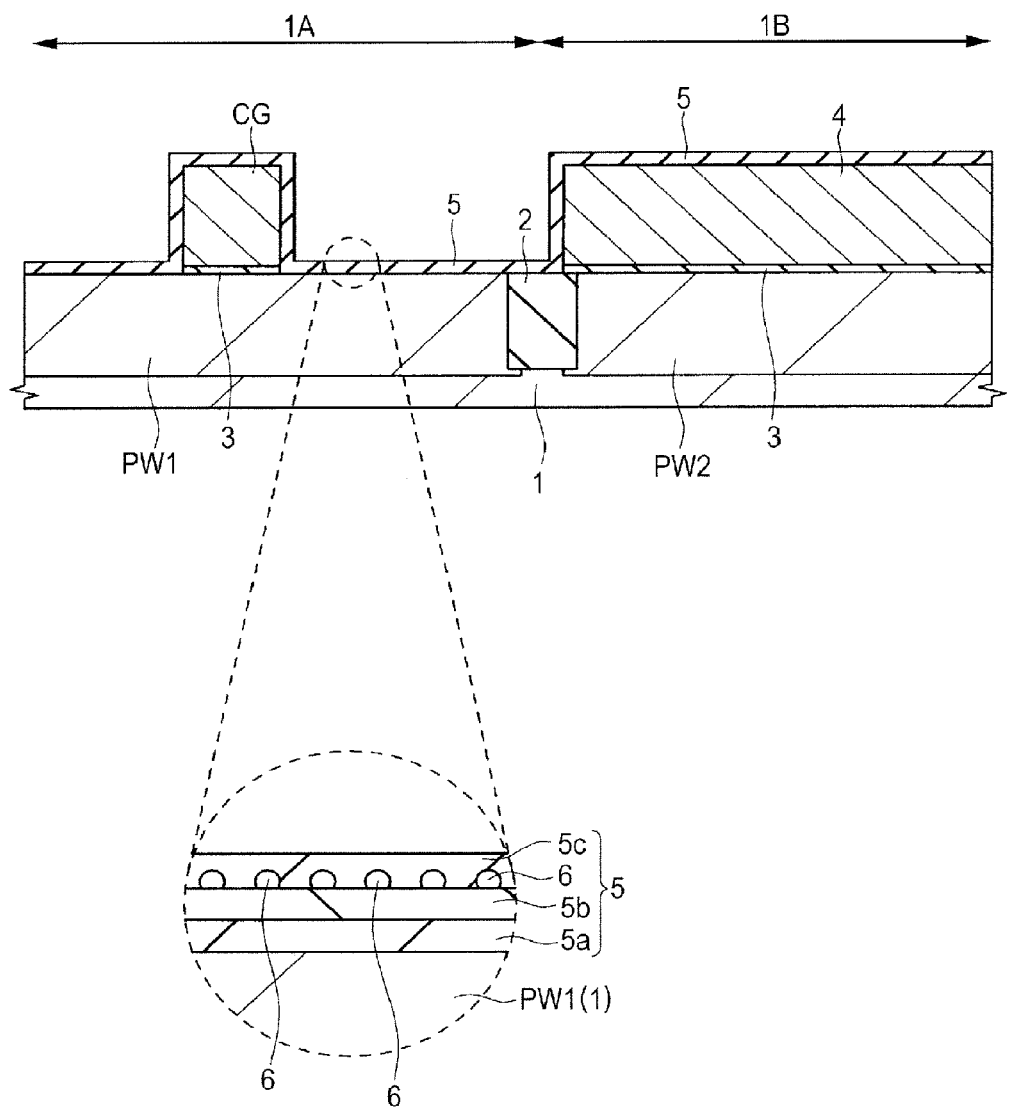
FIG. 11 is a cross-sectional view of a main part of another manufacturing step of the semiconductor device, following the step shown in FIG. 10.

Then, after cleaning the main surface of the semiconductor substrate 1 by a cleaning process, as shown in FIG. 11, the insulating film 5 for the gate insulating film of the memory transistor is formed over the entire main surface of the semiconductor substrate 1, that is, over the main surface (front surface) of the semiconductor substrate 1 and the surface (top surface and sides) of the control gate electrode CG (in step S7 shown in FIG. 5). In the peripheral circuit region 1B, the silicon film 4 remains, so that the insulating film 5 is also formed over the surface (top surface and sides) of the silicon film 4. Thus, in step S7, the insulating film 5 is formed over the semiconductor substrate 1 to cover the silicon films 4 of the control gate electrode CG and in the peripheral circuit region 1B.

The insulating film 5 is an insulating film for the gate insulating film of the memory transistor, and has the charge storage portion therein. The insulating film 5 is comprised of a laminated film including the silicon oxide film (oxide film) 5a, the silicon nitride film (nitride film) 5b formed over the silicon oxide film 5a, the metal dots 6 formed over the silicon nitride film 5b, and the silicon oxide film (oxide film) 5c formed over the silicon nitride film 5b to cover the metal dots 6. For easy understanding of the figure, FIG. 11 illustrates the insulating film 5 comprised of the silicon oxide film 5a, the silicon nitride film 5b, the metal dots 6, and the silicon oxide film 5c, simply as the insulating film 5. Actually, as shown in an enlarged view of a region enclosed by a dotted line circle in FIG. 11, the insulating film 5 is comprised of the silicon oxide film 5a, the silicon nitride film 5b, the metal dots 6, and the silicon oxide film 5c.

Figure 12:
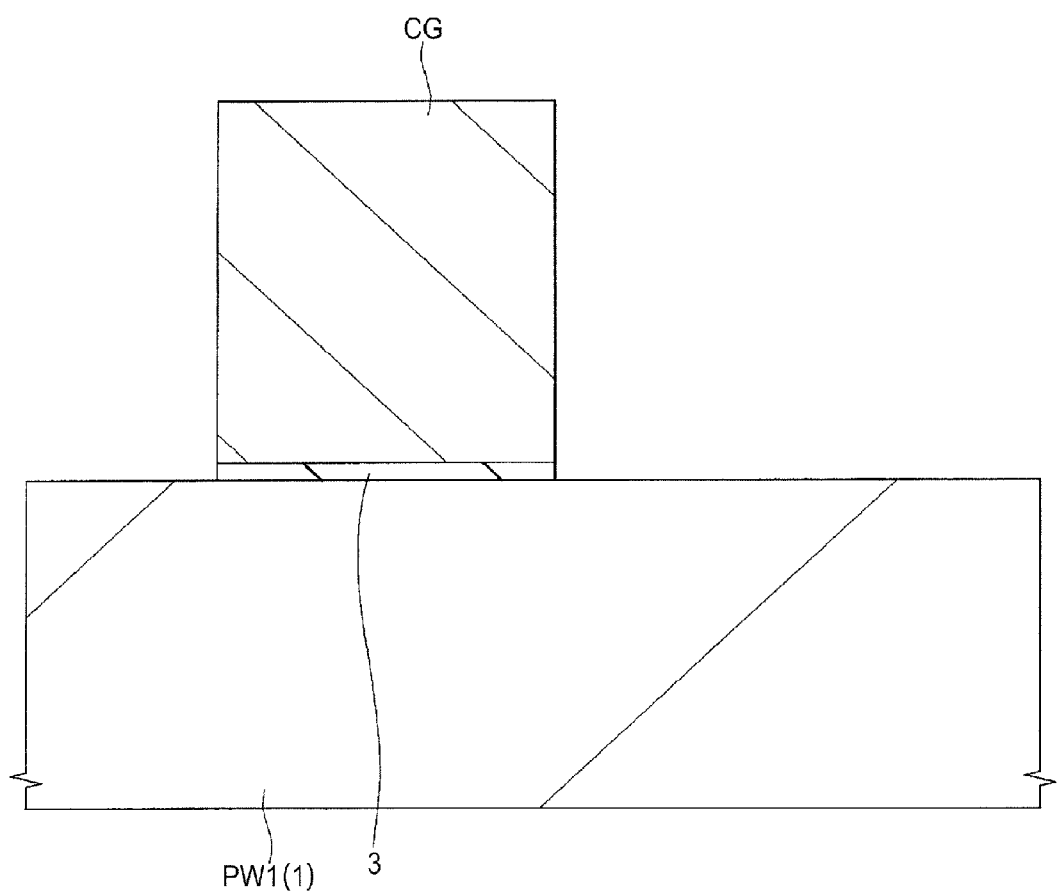
FIG. 12 is a cross-sectional view of another main part of the details of the step shown in FIG. 11.

The formation process of the insulating film 5 in step S7 will be specifically described below with reference to FIGS. 6 and 12 to 16. FIG. 12 illustrates the state directly before the formation of the insulating film 5, corresponding to the same step stage as that shown in FIG. 10 (in the stage before the formation of the insulating film 5 after forming the control gate electrode CG).

Figure 13:
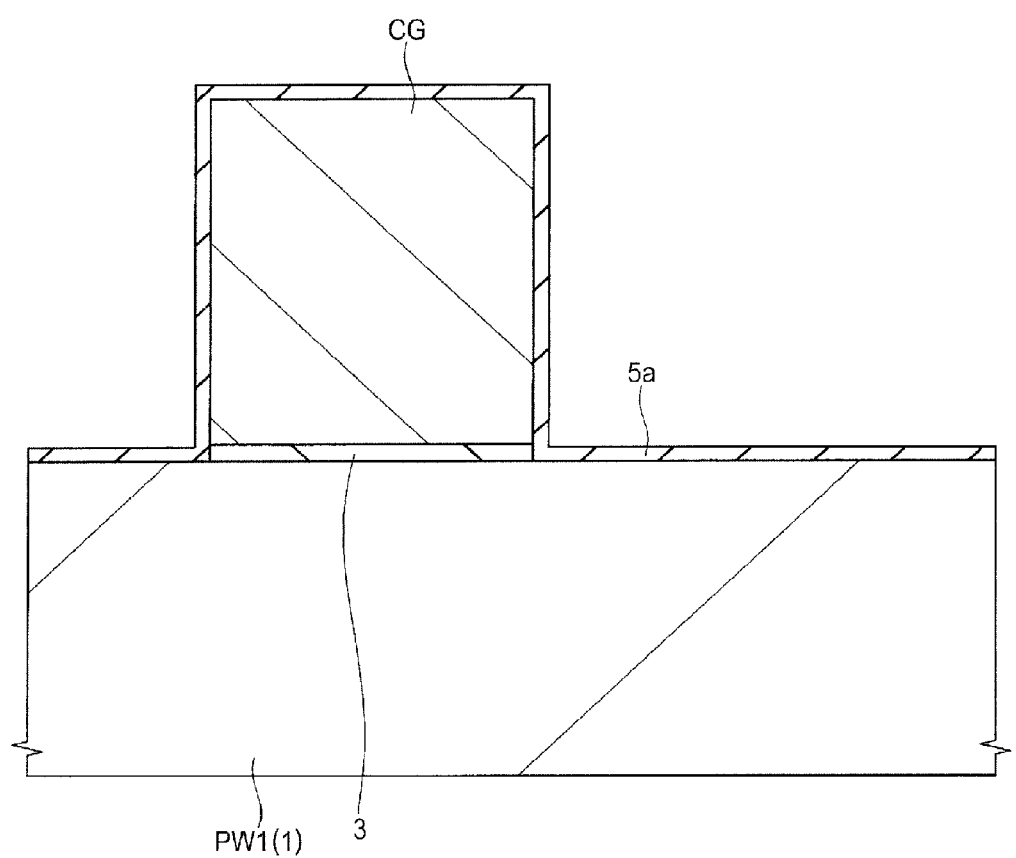
FIG. 13 is a cross-sectional view of another main part of the details of the step shown in FIG. 11.

As shown in FIGS. 10 and 12, in order to form the insulating film 5 after forming the control gate electrode CG, first, as shown in FIG. 13, the silicon oxide film 5a is formed (in step S7a shown in FIG. 6).

The silicon oxide film Sa can be formed, for example, by oxidation (thermal oxidation). The oxidation (thermal oxidation) at this time is more preferably performed using an ISSG (In Situ Steam Generation) oxidation. The thickness (formation thickness) of the silicon oxide film 5a can be, for example, in a range of about 2 to 5 nm. The silicon oxide film 5a can be formed by the CVD method.

The silicon oxide film 5a is formed at the surface of the semiconductor substrate 1 (p-type wells PW1 and PW2) not covered with the control gate electrode CG and the silicon film 4 (silicon film 4 in the peripheral circuit region 1B), the surface (side and upper surface) of the control gate electrode CG, and the surface (side and upper surface) of the silicon film 4 (silicon film 4 in the peripheral circuit region 1B).

Figure 14:
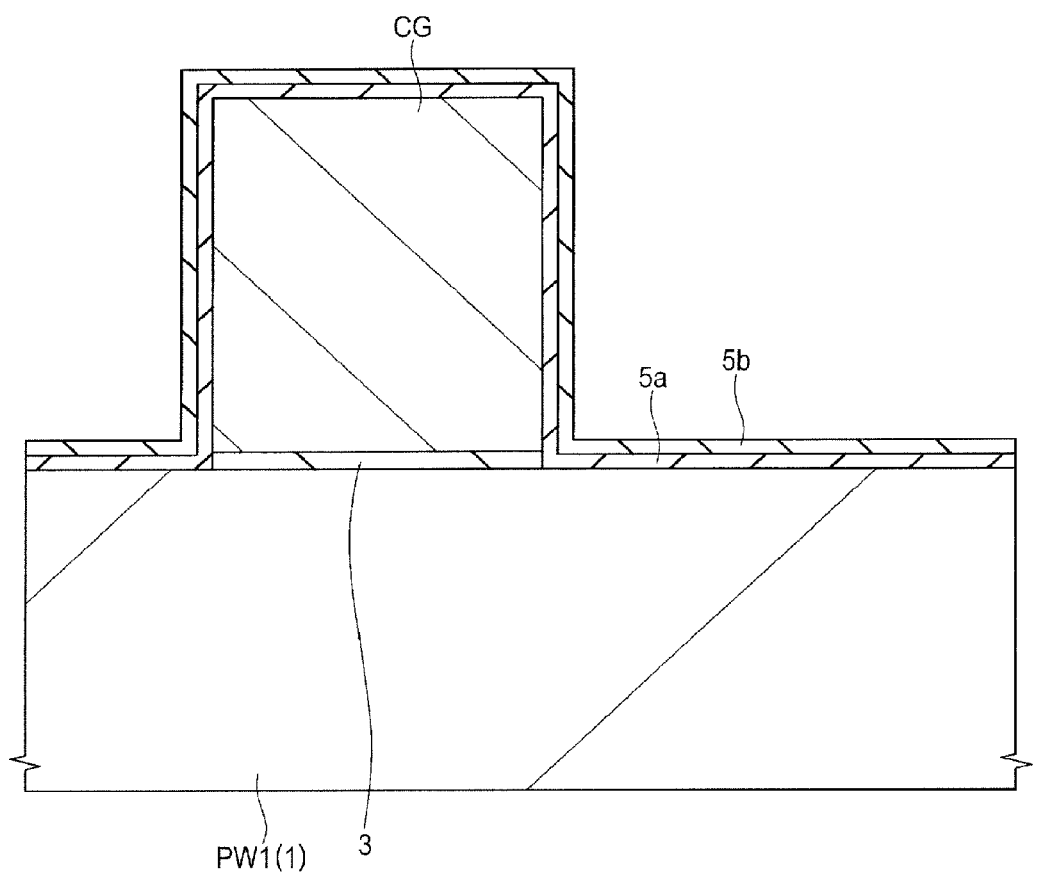
FIG. 14 is a cross-sectional view of another main part of the details of the step shown in FIG. 11.

Next, as shown in FIG. 14, the silicon nitride film 5b is formed over the silicon oxide film 5a (in step S7b shown in FIG. 6).

The silicon nitride film 5b can be formed, for example, by the CVD method or ALD (Atomic Layer Deposition) method. In using the CVD method to form the silicon nitride film 5b, deposition gases for use can include, for example, dichlorosilane ($SiH_2Cl_2$), and ammonia ($NH_3$). In using the ALD method to form the silicon nitride film 5b, deposition gases can include, for example, silane ($SiH_4$) and ammonia ($NH_3$). The thickness (formation thickness) of the silicon nitride film 5b can be, for example, in a range of about 2 to 5 nm.

Figure 15:
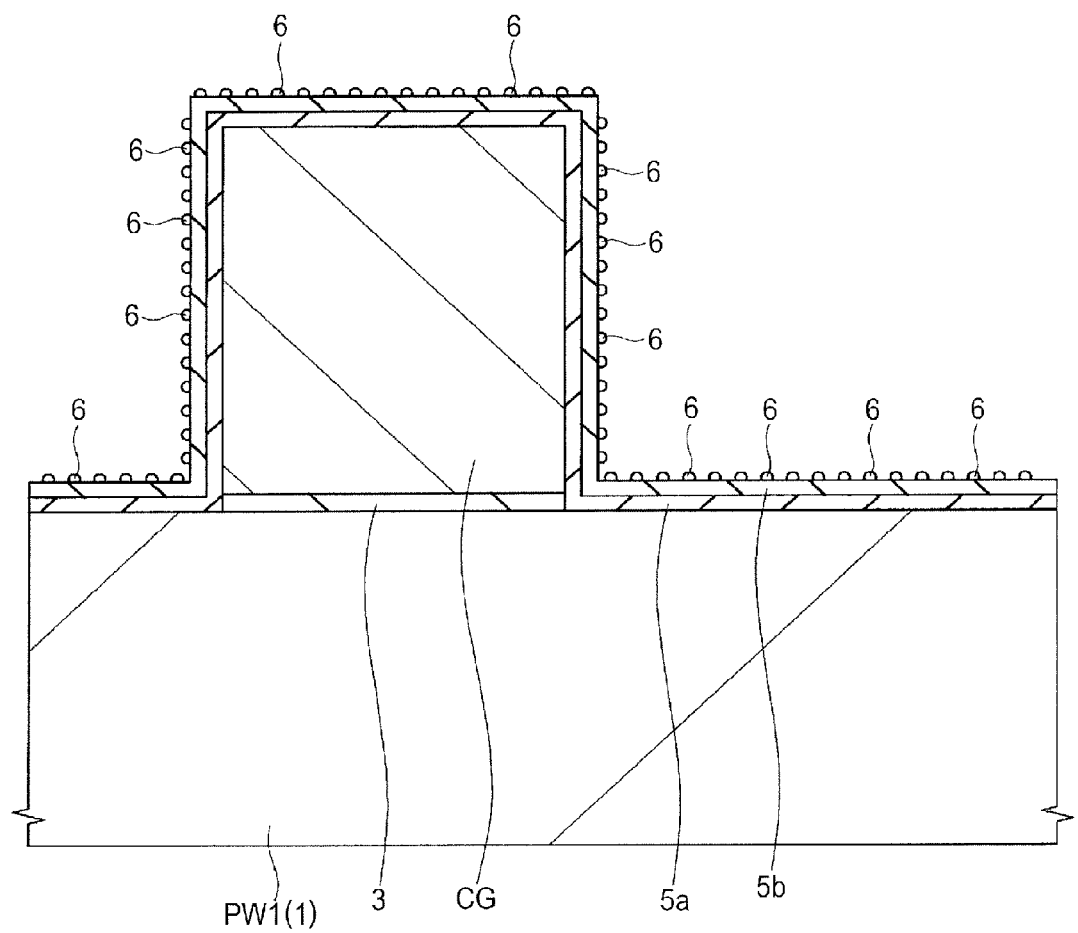
FIG. 15 is a cross-sectional view of another main part of the details of the step shown in FIG. 11.

Then, as shown in FIG. 15, the metal elements M are deposited over the silicon nitride film 5b (in step S7c shown in FIG. 6). In step S7c, the metal elements M are deposited at a surface density of $1\times10^{13}$ to $2\times10^{14}$ atoms/$cm^2$.

In step S7c, the metal elements M are deposited over the silicon nitride film 5b at a surface density of about $1\times10^{13}$ to $2\times10^{14}$ atoms/$cm^2$, so that the metal dots 6 comprised of the metal elements M can be formed over the silicon nitride film 5b. A deposition method of a small amount of metal elements M in step S7c (formation of the metal dots 6) includes, for example, a sputtering method and an ALD method. The sputtering method is more preferable because it is less affected by the presence of an underlayer.

In step S7c, the metal atoms (atoms of the metal element M) are attached (deposited) over the silicon nitride film 5b, but the attached (deposited) metal atoms are not continuously formed in a planar manner to form a continuous film. That is, about several metal atoms are gathered and attached to the silicon nitride film 5b into an individual metal dot 6. The metal dots 6 are spaced apart from each other. That is, the metal dots 6 are dispersed and formed (arranged) over the surface (upper surface) of the silicon nitride film 5b.

The metal dot 6 is a lump of several (about 10 or less on average (as the median)) metal atoms (fine particles), and thus can be regarded as a grain having a size of less than 1 nm (particle, or lump of metal atoms). That is, each metal dot 6 is comprised of about ten or less (one to ten) of metal atoms. As the distance between the charges is small, a strong coulomb repellent force works, so that one electron can be stored in one metal dot 6 in the manufactured semiconductor device (memory cell MC thereof). That is, the number of metal atoms included in one metal dot 6 is about several (one metal dot 6 being comprised of several atoms), which is so small that one metal dot 6 cannot store therein electrons. One metal dot 6 can store therein even one electron.

In this way, the metal elements (metal atoms) are deposited over the silicon nitride film 5b at a surface density of $1\times10^{13}$ to $2\times10^{14}$ atoms/$cm^2$ to form the metal dots 6. In this case, when one metal dot 6 is comprised of about five to ten metal atoms on average, the metal dots 6 are dispersed over the silicon nitride film 5b at a density of about $1\times10^{12}$ to $2\times10^{14}$ atoms per $cm^2$. In this case, since one metal dot 6 can store therein one electron in the manufactured semiconductor device (memory cell MC thereof), the electrons are stored in the metal dots 6 dispersed over the silicon nitride film 5b, which can store the electrons at $1\times10^{12}$ to $4\times10^{13}$ electrons/$cm^2$.

Figure 16:
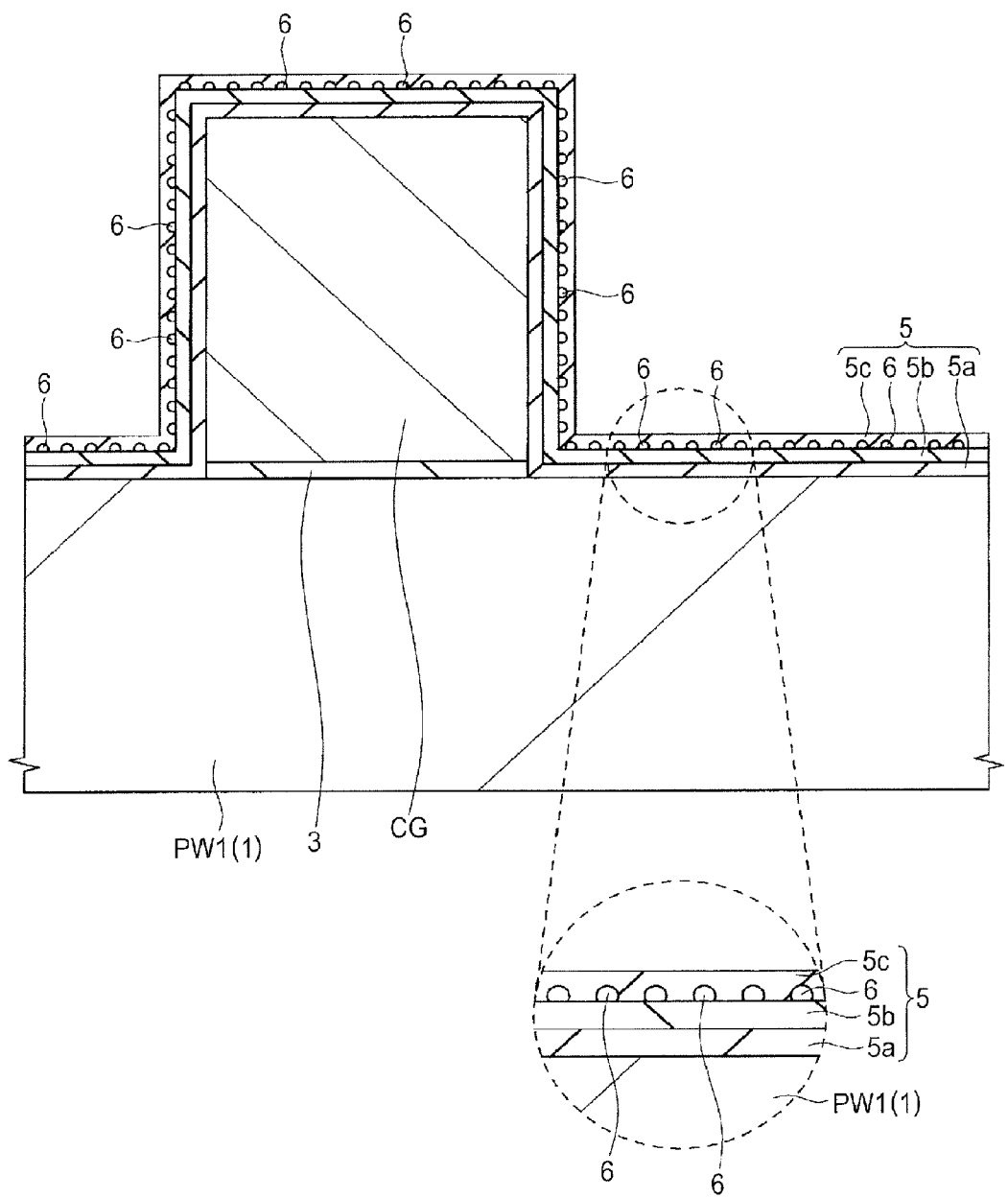
FIG. 16 is a cross-sectional view of another main part of the details of the step shown in FIG. 11.

Then, as shown in FIG. 16, the silicon oxide film 5c is formed over the silicon nitride film 5b to cover the metal dots 6 (in step S7d shown in FIG. 6).

The silicon oxide film 5c can be formed, for example, by the CVD method. At this time, the CVD method using TEOS (tetraethyl orthosilicate: $Si(OC_2H_5)_4$) can be applied. Alternatively, DCS (dichlorosilane: $SiCl_2H_2$) gas and $N_2O_2$ (dinitrogen dioxide) gas are reacted with each other, and used to form a DCS-HTO (high temperature oxide) oxide film, which can form the silicon oxide film 5c. The thickness (formation thickness) of the silicon oxide film 5c can be, for example, in a range of about 2 to 5 nm.

When the thickness of the silicon oxide film 5a is in a range of about 2 to 5 nm, the thickness of the silicon nitride film 5b is in a range of about 2 to 5 nm, and the thickness of the silicon oxide film 5c is in a range of about 2 to 5 nm, an equivalent oxide thickness (EOT) of the insulating film 5 is in a range of about 5.5 to 13.7 nm.

The insulating film 5 formed in the memory cell region 1A serves as the gate insulating film of the memory gate electrode MG to be formed later to have a function of holding charges (storing charges). The insulating film 5 includes the charge storage portion (herein the silicon nitride film 5b and the metal dots 6) sandwiched between the charge blocking layers (herein the silicon oxide films 5a and 5c) so as to obtain the necessary charge holding function. A potential barrier height of the charge blocking layers (herein silicon oxide films 5a and 5c) is higher than a potential barrier height of the charge storage portion (herein silicon nitride film 5b and metal dots 6).

In this way, the processes in steps S7a, S7b, S7c, and S7d are performed to form the insulating film 5 comprised of the silicon oxide film 5a, the silicon nitride film 5b, the metal dots 6, and the silicon oxide film 5c as shown in FIG. 16. FIGS. 11 and 16 correspond to the same step stage (in the stage after the formation of the silicon oxide film 5c in step S7d, that is, in the stage after the completion of the formation of the insulating film 5).

Figure 17:
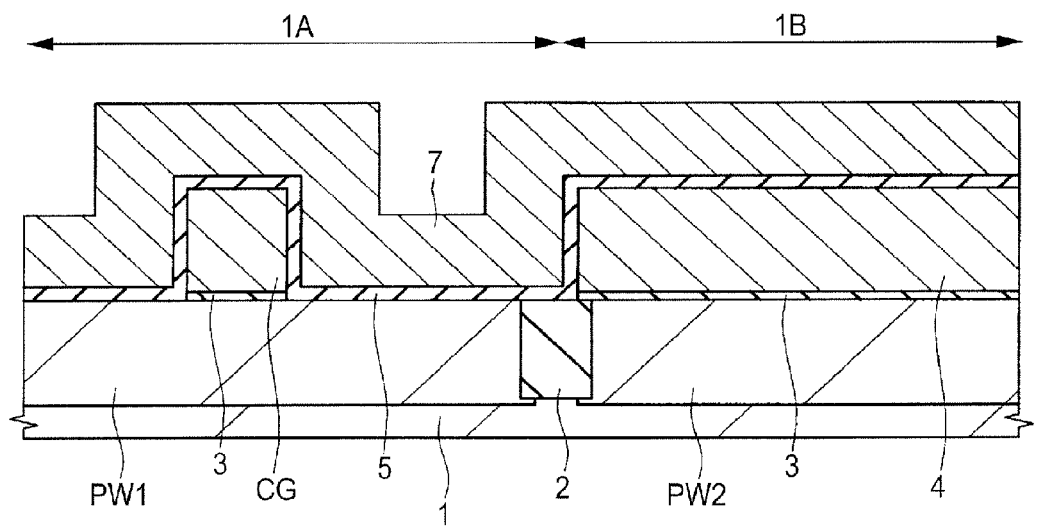
FIG. 17 is a cross-sectional view of a main part of a manufacturing step of the semiconductor device, following the step shown in FIG. 11.

Then, as shown in FIG. 17, the silicon film 7 is formed (deposited) as a conductive film for formation of the memory gate electrode MG, over the main surface (entire main surface) of the semiconductor substrate 1, that is, over the insulating film 5, to cover the control gate electrode CG in the memory cell region 1A, and to cover the silicon film 4 in the peripheral circuit region 1B (in step S8 shown in FIG. 5).

The silicon film 7 can be formed of a polycrystalline silicon film by the CVD method or the like. The thickness (deposition thickness) of the silicon film 7 can be, for example, in a range of about 30 to 150 nm. Alternatively, in deposition, the silicon film 7 is formed as an amorphous silicon film, and then the amorphous silicon film can be converted into a polycrystalline silicon film by the following heat treatment.

The silicon film 7 into which n-type impurities are introduced has a low resistivity. The n-type impurities can also be introduced into the silicon film 7 by ion implantation after deposition of the silicon film 7. Alternatively, n-type impurities can also be introduced into the silicon film 7 being deposited. When the n-type impurities are introduced into the silicon film 7 being deposited, gas for deposition of the silicon film 7 contains a doping gas (gas for addition of the n-type impurities), so that the silicon film 7 with the n-type impurities introduced thereinto can be deposited. In either case, the n-type impurities are introduced into the memory cell region 1A and the peripheral circuit region 1B to form the silicon film 7.

Then, the silicon film 7 is etched back (subjected to etching, dry etching, or anisotropic etching) by the anisotropic etching technique (in step S9 shown in FIG. 5).

Figure 18:
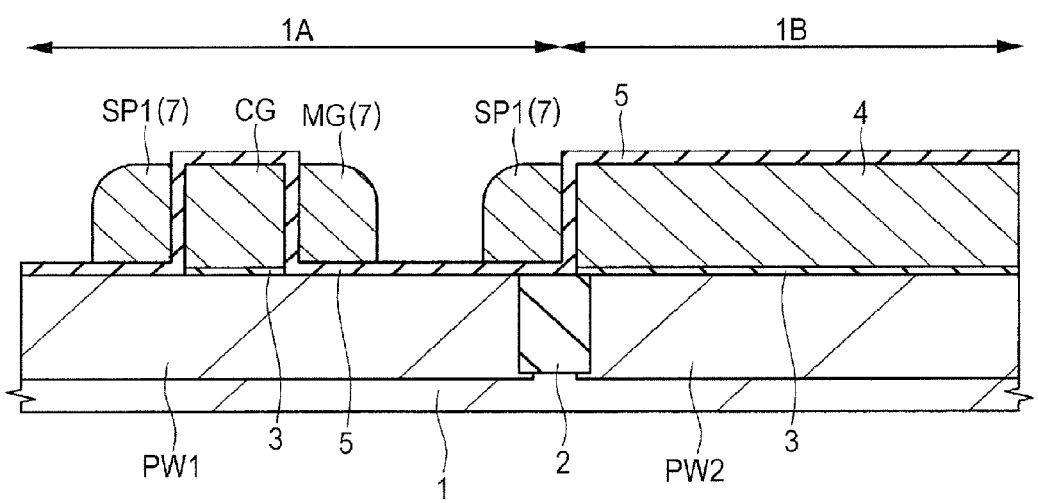
FIG. 18 is a cross-sectional view of a main part of a manufacturing step of the semiconductor device, following the step shown in FIG. 17.

In the etch back process shown in step S9, the silicon film 7 is subjected to the anisotropic etching (etched back) by the deposition thickness of the silicon film 7, whereby the silicon film 7 remains in the sidewall spacer form over each sidewall of the control gate electrode CG (via the insulating film 5) by removing the silicon film 7 located in other regions. Thus, as shown in FIG. 18, in the memory cell region 1A, the silicon film 7 remains in the sidewall spacer form over one of both sidewalls of the control gate electrode CG via the insulating film 5, which forms the memory gate electrode MG. The silicon film 7 remains in the sidewall spacer form over the other sidewall via the insulating film 5, which forms the silicon spacer SP1. The memory gate electrode MG is formed over the insulating film 5 so as to be adjacent to the control gate electrode CG via the insulating film 5.

The silicon spacer SP1 can be regarded as the sidewall spacer comprised of a conductor, that is, a conductor spacer. The memory gate electrode MG and the silicon spacer SP1 are formed over the opposite sidewalls of the control gate electrode CG, and have substantially the symmetric structure to each other with the control gate electrode CG sandwiched therebetween. The silicon spacer SP1 can also be formed over the sidewall of the silicon film 4 remaining in the peripheral circuit region 1B via the insulating film 5.

The insulating film 5 is exposed in the regions not covered with the memory gate electrode MG and the silicon spacer SP1 after the completion of the etching back process in step S9. The insulating film 5 intervenes in between the semiconductor substrate 1 (p-type well PW1) and the memory gate electrode MG formed in step S9, and in between the memory gate electrode MG and the control gate electrode CG. The insulating film 5 under the memory gate electrode MG in the memory cell region 1A serves as the gate insulating film of the memory transistor. By adjusting the deposition thickness of the silicon film 7 deposited in step S8, the gate length of the memory (gate length of the memory gate electrode MG) can be adjusted.

Figure 19:
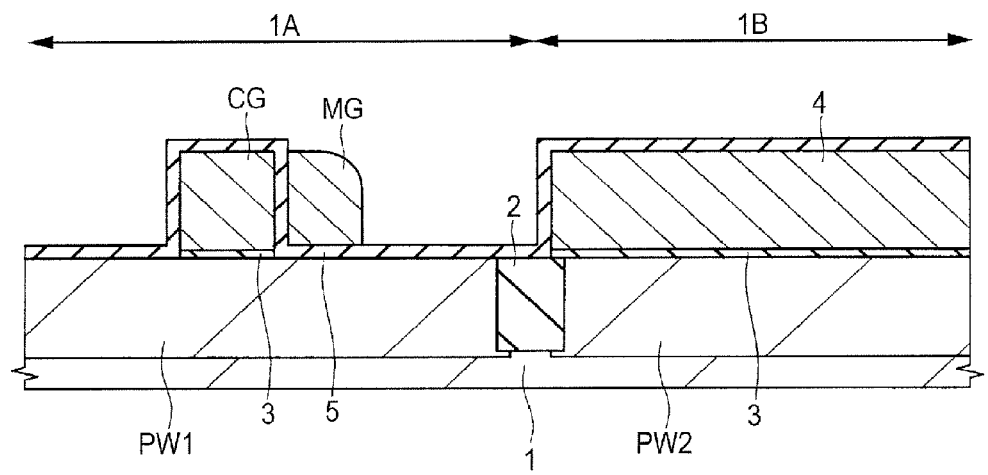
FIG. 19 is a cross-sectional view of a main part of a manufacturing step of the semiconductor device, following the step shown in FIG. 18.

Then, a photoresist pattern (not shown) is formed over the semiconductor substrate 1 so as to cover the memory gate electrode MG and to expose the silicon spacer SP1 using the photolithography, and the silicon spacers SP1 are removed by dry etching using the photoresist pattern as an etching mask (in step S10 shown in FIG. 5). Then, the photoresist pattern is removed. In an etching process shown in step S10, as shown in FIG. 19, the silicon spacers SP1 are removed, but the memory gate electrode MG remains without being etched because it is covered with the photoresist pattern.

Figure 20:
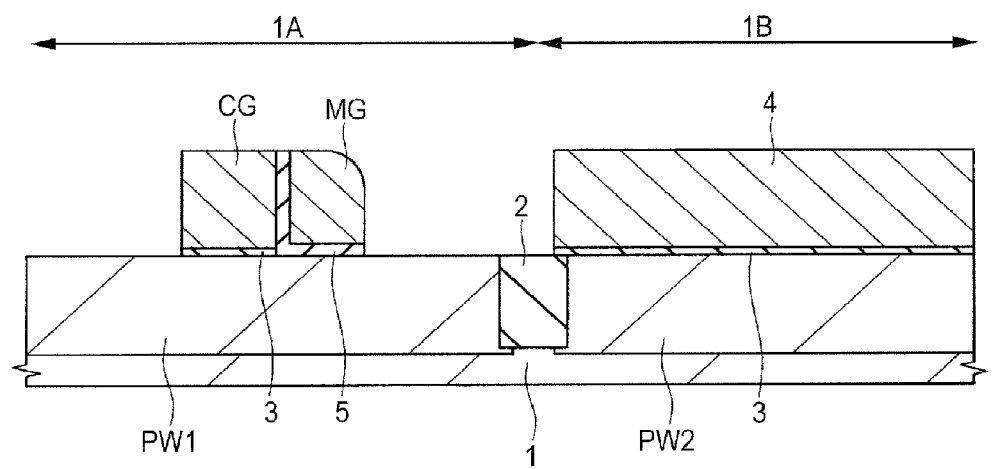
FIG. 20 is a cross-sectional view of a main part of a manufacturing step of the semiconductor device, following the step shown in FIG. 19.

As shown in FIG. 20, the part of the insulating film 5 exposed and not covered by the memory gate electrode MG is removed by etching (for example, wet etching) (in step S11 of FIG. 5). At this time, in the memory cell region 1A, the insulating film 5 remains under the memory gate electrode MG and between the memory gate electrode MG and the control gate electrode CG without being removed, and the insulating film 5 in other regions is removed. As can be seen from FIG. 20, the insulating film 5 continuously extends both over a region between the memory gate electrode MG and the semiconductor substrate 1 (p-type well PW1) and over a region between the memory gate electrode MG and the control gate electrode CG in the memory cell region 1A.

Figure 21:
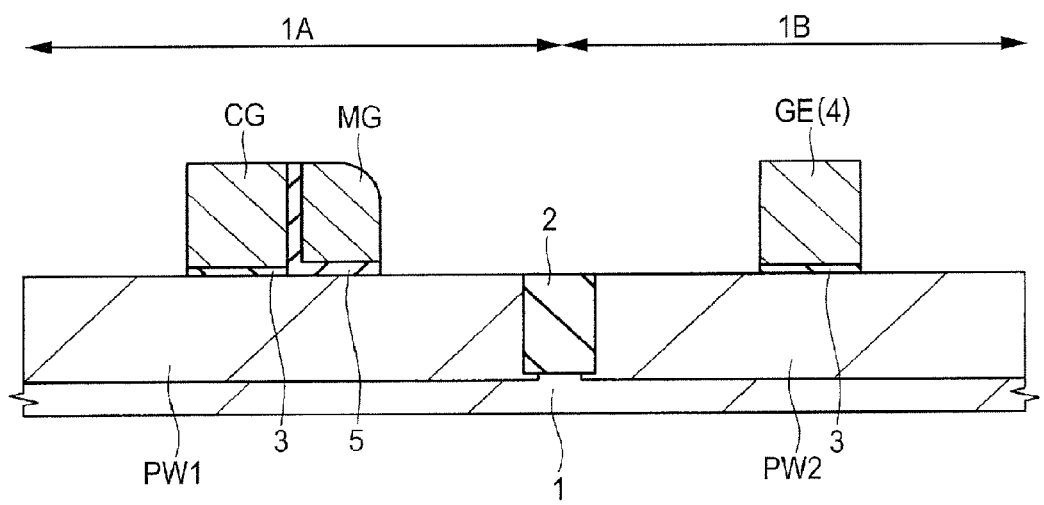
FIG. 21 is a cross-sectional view of a main part of a manufacturing step of the semiconductor device, following the step shown in FIG. 20.

Then, as shown in FIG. 21, the gate electrode GE is formed in the peripheral circuit region 1B by patterning the silicon film 4 in the peripheral circuit region 1B by the photolithography and etching (in step S12 shown in FIG. 5). The patterning process in step S12 can be performed, for example, in the following way.

That is, a photoresist pattern is formed over the silicon film 4 in the peripheral circuit region 1B by the photolithography (not shown, but the photoresist pattern is formed in the entire memory cell region 1A and in a region of the peripheral circuit region 1B where a p-channel MISFET is to be formed). Then, n-type impurities are introduced by the ion implantation into the silicon film 4 in the peripheral circuit region 1B using the photoresist pattern as a mask. Thus, the silicon film 4 in the region where the n-channel MISFET is to be formed in the peripheral circuit region 1B becomes the n-type silicon film 4. Thereafter, another photoresist pattern is formed over the silicon film 4 by the photolithography (not shown, the photoresist pattern is formed over the entire memory cell region 1A and the region of the peripheral circuit region 1B where the gate electrode GE are to be formed.) Then, the silicon film 4 is patterned by etching (dry etching) using the photoresist pattern as an etching mask. At this time, the memory cell region 1A is covered with the photoresist pattern, and not etched. Then, the photoresist pattern is removed. Thus, as shown in FIG. 21, the gate electrode GE comprised of the patterned n-type silicon film 4 is formed in the peripheral circuit region 1B. The gate electrode GE is a gate electrode of the MISFET including the peripheral circuit.

Figure 22:
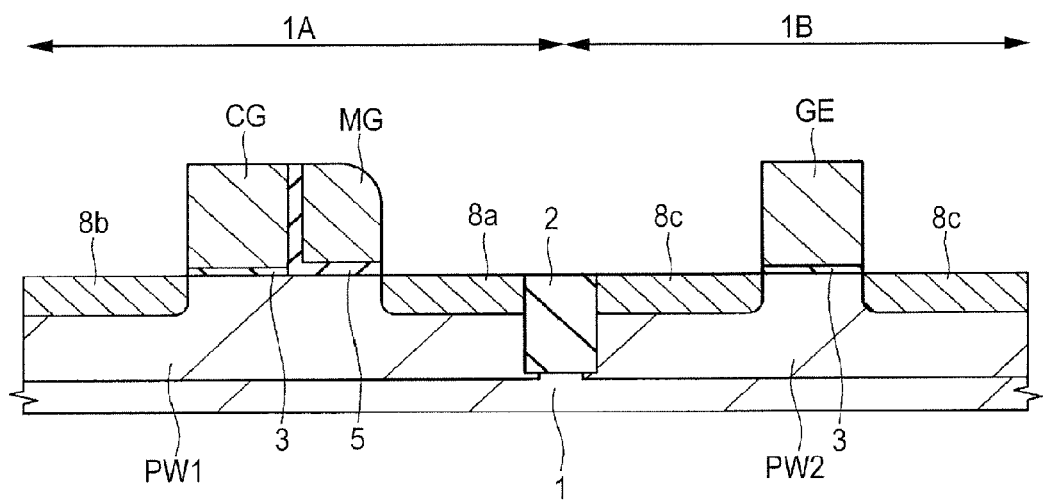
FIG. 22 is a cross-sectional view of a main part of a manufacturing step of the semiconductor device, following the step shown in FIG. 21.

Then, n-type impurities, such as arsenic (As) or phosphorus (P), are introduced (doped) into the semiconductor substrate 1 (p-type wells PW1 and PW2) by the ion implantation or the like using the control gate electrode CG, the memory gate electrode MG, and the gate electrode GE as the mask (ion implantation inhibition mask). As shown in FIG. 22, $n^-$-type semiconductor regions (impurity diffusion layers) 8a, 8b, and 8c are formed (in step S13 shown in FIG. 5).

At this time, the $n^-$-type semiconductor region 8a is formed in self-alignment with the sidewall of the memory gate electrode MG (sidewall opposite to the side adjacent to the control gate electrode CG via the insulating film 5) in the memory cell region 1A. The $n^-$type semiconductor region 8b is formed in self-alignment with the sidewall of the control gate electrode CG (sidewall opposite to the side adjacent to the memory gate electrode MG via the insulating film 5) in the memory cell region 1A. The n-type semiconductor region Sc is formed in self-alignment with both sidewalls of the gate electrode GE in the peripheral circuit region 1B. The $n^-$-type semiconductor region 8a and the $n^-$-type semiconductor region 8b serves as parts of source/drain (source or drain) of the memory cell formed in the memory cell region 1A. The $n^-$-type semiconductor region 8c can serve as a part of the source/drain region (source or drain) of the MISFET formed in the peripheral circuit region 1B. The $n^-$-type semiconductor region 8a, the $n^-$-type semiconductor region 8b and the $n^-$-type semiconductor region 8c can be formed in the same ion implantation step, but can be formed in different ion implantation steps.

Figure 23:
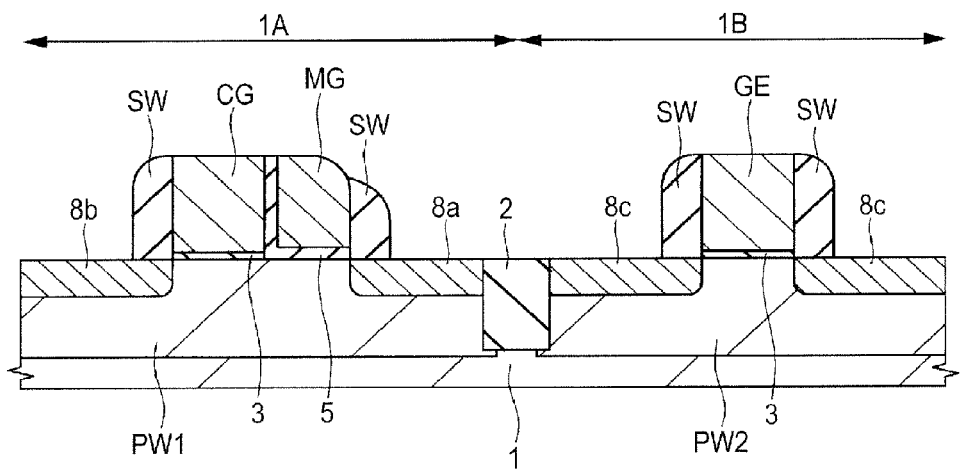
FIG. 23 is a cross-sectional view of a main part of a manufacturing step of the semiconductor device, following the step shown in FIG. 22.

Then, as shown in FIG. 23, sidewall spacers (sidewalls, sidewall insulating films) SW are formed over the sidewalls of the control gate electrode CG and the memory gate electrode MG (sidewalls opposite to the sides of both gate electrodes adjacent to each other via the insulating film 5), and over the sidewalls of the gate electrode GE (in step S14 shown in FIG. 5). The sidewall spacer SW is comprised of an insulating film (silicon oxide film, silicon nitride film, or a lamination thereof).

A formation process of the sidewall spacer SW in step S14 can be performed, for example, in the following way. Specifically, an insulating film (silicon oxide film, silicon nitride film, or a laminated film thereof) is deposited over the entire main surface of the semiconductor substrate 1 by the CVD method, and subjected to the anisotropic etching (etched back). The insulating film is selectively left over the sidewalls of the control gate electrode CG and the memory gate electrode MG (sidewalls opposite to the sides adjacent to each other via the insulating film 5), and over the sidewalls of the gate electrodes GE1 and GE2 to thereby form the sidewall spacers SW. The sidewall spacer SW is formed over each of both sidewalls of the gate electrode GE, over the sidewall of the control gate electrode CG on the side opposite to the side adjacent to the memory gate electrode MG via the insulating film 5, and over the sidewall of the memory gate electrode MG on the side opposite to the side adjacent to the control gate electrode CG via the insulating film 5.

Figure 24:
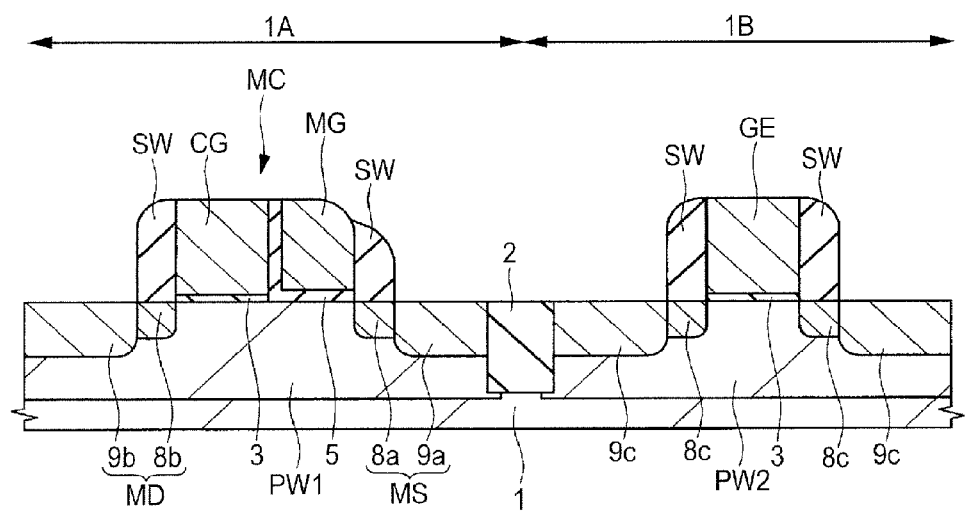
FIG. 24 is a cross-sectional view of a main part of a manufacturing step of the semiconductor device, following the step shown in FIG. 23.

Then, as shown in FIG. 24, $n^+$-type semiconductor regions (impurity diffusion layers) 9a, 9b, and 9c are formed by the ion implantation or the like (in step S15 shown in FIG. 5).

In step S15, n-type impurities, such as arsenic (As) or phosphorus (P), are introduced (doped) into the semiconductor substrate 1 (p-type wells PW1 and PW2) using the control gate electrode CG, the memory gate electrode MG, the gate electrode GE, and the sidewall spacers SW formed over the sidewalls thereof as a mask (ion implantation interruption mask), so that the $n^+$-type semiconductor regions 9a, 9b, and 9c can be formed. At this time, the $n^+$-type semiconductor region 9a is formed in self-alignment with the sidewall spacer SW formed over the sidewall of the memory gate electrode MG in the memory cell region 1A. The $n^+$-type semiconductor region 9b is formed in self-alignment with the sidewall spacer SW formed over the sidewall of the control gate electrode CG in the memory cell region 1A. The $n^+$-type semiconductor region 9c is formed in self-alignment with the sidewall spacer SW formed over each sidewall of the gate electrode GE in the peripheral circuit region 1B. In this way, the LDD structure is formed. The $n^+$-type semiconductor region 9a, the $n^+$-type semiconductor region 9b, and the $n^+$-type semiconductor region 9c can be formed in the same ion implantation step, but can be formed in different ion implantation steps.

Thus, the $n^-$-type semiconductor region 8a and the $n^+$-type semiconductor region 9a having a higher impurity concentration than that of the semiconductor region 8a form the n-type semiconductor region MS serving as the source of the memory transistor. The $n^-$-type semiconductor region 8b and the $n^+$-type semiconductor region 9b having a higher impurity concentration than that of the semiconductor region 8b form the n-type semiconductor region MD serving as the drain of the control transistor. The $n^-$-type semiconductor region 8c and the $n^+$-type semiconductor region 9c having a higher impurity concentration than that of the semiconductor region Sc form the n-type semiconductor region serving as the source/drain of the MISFET in the peripheral circuit region 1B.

Then, activation anneal is performed as the heat treatment to activate impurities introduced into the semiconductor regions ($n^-$-type semiconductor regions 8a, 8b, and 8c and $n^+$-type semiconductor regions 9a, 9b, and 9c) for the source and drain (in step S16 shown in FIG. 5).

In this way, the memory cell MC is formed as the nonvolatile memory in the memory cell region 1A, and the MISFET is formed in the peripheral circuit region 1B.

Then, a silicon oxide film (not shown) is formed over the entire main surface of the semiconductor substrate 1 using the CVD method or the like. Then, the silicon oxide film (which remains over the silicon region where the metal silicide layer 11 should not be formed) is selectively removed by the photolithography and etching. This exposes the respective silicon surfaces (silicon regions or silicon films) located over the upper surfaces (front surfaces) of the $n^+$-type semiconductor regions 9a, 9b, and 9c, the upper surface of the control gate electrode CG, the upper surface of the memory gate electrode MG, and the upper surface of the gate electrode GE.

Figure 25:
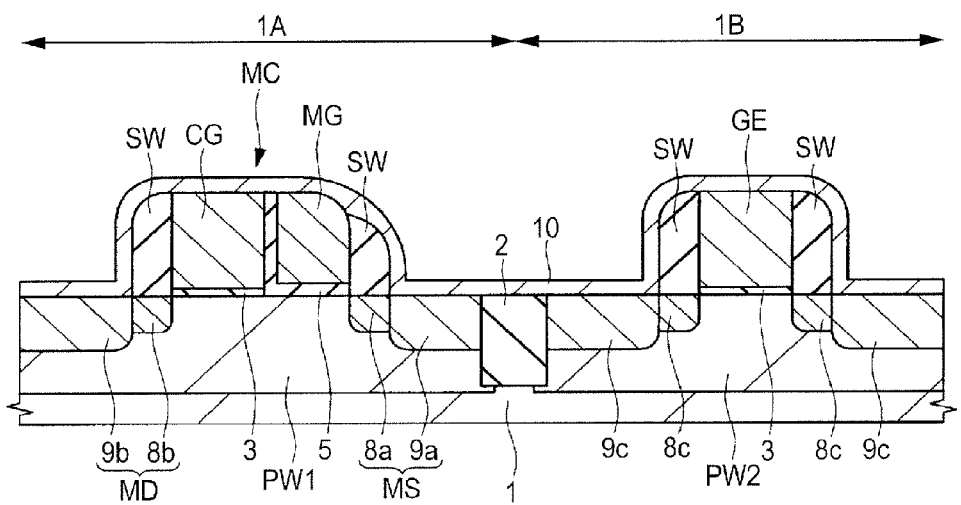
FIG. 25 is a cross-sectional view of a main part of a manufacturing step of the semiconductor device, following the step shown in FIG. 24.

Then, as shown in FIG. 25, a metal film 10 is formed (deposited) over the entire main surface of the semiconductor substrate 1 so as to cover the control gate electrode CG, the memory gate electrode MG, the gate electrode GE, and the sidewall spacers SW. The entire main surface of the substrate includes the upper surfaces (front surfaces) of the $n^+$-type semiconductor regions 9a, 9b, and 9c, the upper surface (part not covered with the sidewall spacers SW) of the memory gate electrode MG, the upper surface of the control gate electrode CG, and the upper surface of the gate electrode GE. The metal film 10 can be formed of, for example, a cobalt (Co) film, a nickel (Ni) film, or a nickel-platinum alloy film, using the sputtering or the like.

Figure 26:
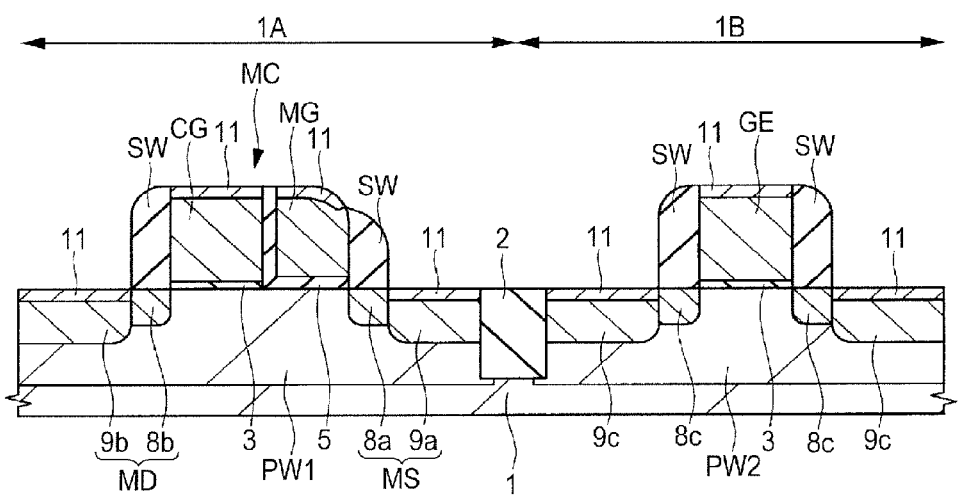
FIG. 26 is a cross-sectional view of a main part of a manufacturing step of the semiconductor device, following the step shown in FIG. 25.

Then, the heat treatment is applied to the semiconductor substrate 1, so that the metal film 10 is reacted with the upper layer parts (surface layer parts) of the $n^+$-type semiconductor regions 9a, 9b, and 9c, the control gate electrode CG (silicon film 4), the memory gate electrode MG (silicon film 7), and the gate electrode GE (silicon film 4). As a result, referring to FIG. 26, the metal siliside layer 11 is formed over the upper part (upper surface, front surface, or upper layer) of the $n^+$-type semiconductor regions 9a, 9b, and 9c, the control electrode CG (silicon film 4), the memory gate electrode MG (silicon film 7), and the gate electrode GE (silicon film 4). The metal silicide layer 11 can be, for example, a cobalt silicide layer (when the metal film 10 is a cobalt film), a nickel silicide layer (when the metal film 10 is a nickel film), or a platinum-added nickel silicide layer (when the metal film 10 is a nickel-platinum alloy film). Thereafter, a non-reacted part of the metal film 10 is removed. FIG. 26 shows the cross-sectional view of this stage.

In this way, the so-called Salicide (Self Aligned Silicide) process is performed to form the metal silicide layer 11 over each of the $n^+$-type semiconductor regions 9a, 9b, and 9c, the control gate electrode CG, the memory gate MG, and the gate electrode GE, which can decrease a resistance of the source, drain, and each gate electrode (CG, MG, GE).

Figure 27:
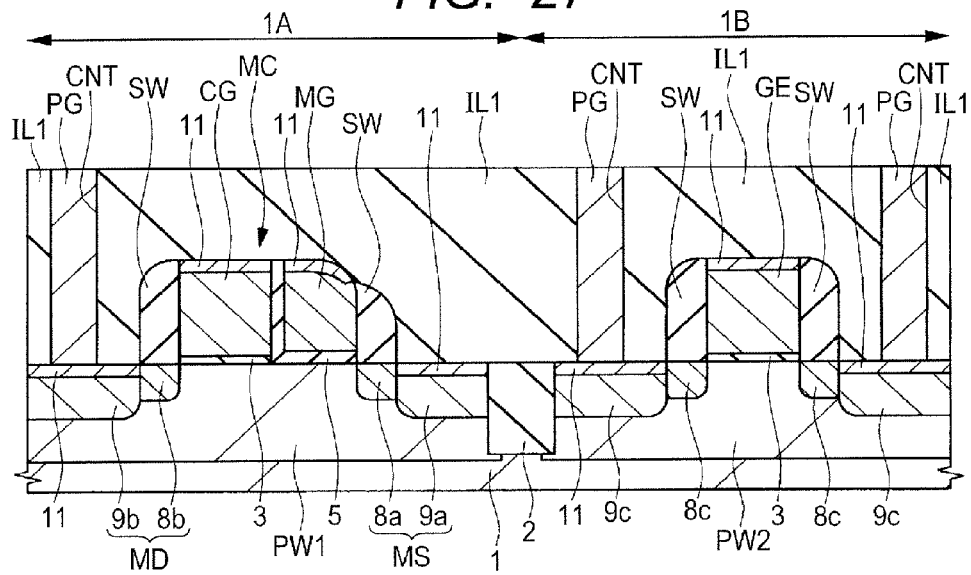
FIG. 27 is a cross-sectional view of a main part of a manufacturing step of the semiconductor device, following the step shown in FIG. 26.

Then, as shown in FIG. 27, the interlayer insulating film IL1 is formed (deposited) as the insulating film over the entire main surface of the semiconductor substrate 1 to cover the control gate electrode CG, the memory gate electrode MG, the gate electrode GE, and the sidewall spacers SW.

The interlayer insulating film IL1 is comprised of a single film of a silicon oxide film, or a laminated film of a silicon nitride film and a silicon oxide film formed over the silicon nitride film more thickly than the silicon nitride film. The interlayer insulating film IL1 can be formed, for example by the CVD method or the like. After forming the interlayer insulating film IL1, the upper surface of the interlayer insulating film IL1 is flattened by a chemical mechanical polishing (CMP) method or the like if necessary.

Then, the interlayer insulating film IL1 is dry etched using a photoresist pattern (not shown) formed over the interlayer insulating film IL1 by the photolithography as an etching mask to thereby form the contact holes (openings, through holes) in the interlayer insulating film IL1.

Then, conductive plug PG comprised of tungsten (W) or the like is formed as a conductor (conductor for connection) in each contact hole CNT.

In order to form the plug PG, for example, a barrier conductive film (for example, a titanium film, a titanium nitride film, or a laminated film thereof) is formed over the interlayer insulating film IL1 including the inside (bottom and sidewalls) of the contact hole CNT. Then, a main conductive film comprised of a tungsten film or the like is formed over the barrier conductive film to fill the contact hole CNT. Then, unnecessary parts of the main conductive film and the barrier conductive film located over the interlayer insulating film IL1 are removed by the CMP method or etch back method, so that the plugs PG can be formed. For easy understanding, FIG. 27 shows the integration of the barrier conductive film and the main conductive film (tungsten film) included in the plug PG.

The contact holes CNT and the plugs PG embedded therein are formed over the $n^+$-type semiconductor regions 9a, 9b, and 9c, the control gate electrode CG, the memory gate electrode MG, and the gate electrode GE. At the bottom of the contact hole CNT, are exposed parts of the main surface of the semiconductor substrate 1, for example, parts of the $n^+$-type semiconductor regions 9a, 9b, and 9c (metal silicide layer 11 over the surface thereof), a part of the control electrode CG (metal silicide layer 11 over the surface thereof), a part of the memory gate electrode MG (metal silicide layer 11 over the surface thereof), and a part of the gate electrode GE (metal silicide layer 11 over the surface thereof). As shown in the cross-sectional view of FIG. 27, parts of the $n^+$-type semiconductor regions 9b and 9c (metal silicide layer 11 over the surfaces thereof) are exposed at the bottoms of the contact holes CNT, and electrically coupled to the respective plugs PG filling the contact holes CNT.

Then, a first layer wiring (wiring layer) M1 is formed over the interlayer insulating film IL1 with the plug PG embedded therein. The wiring M1 is formed by the damascene technique (which is herein a single damascene technique), which will be described below.

Figure 28:
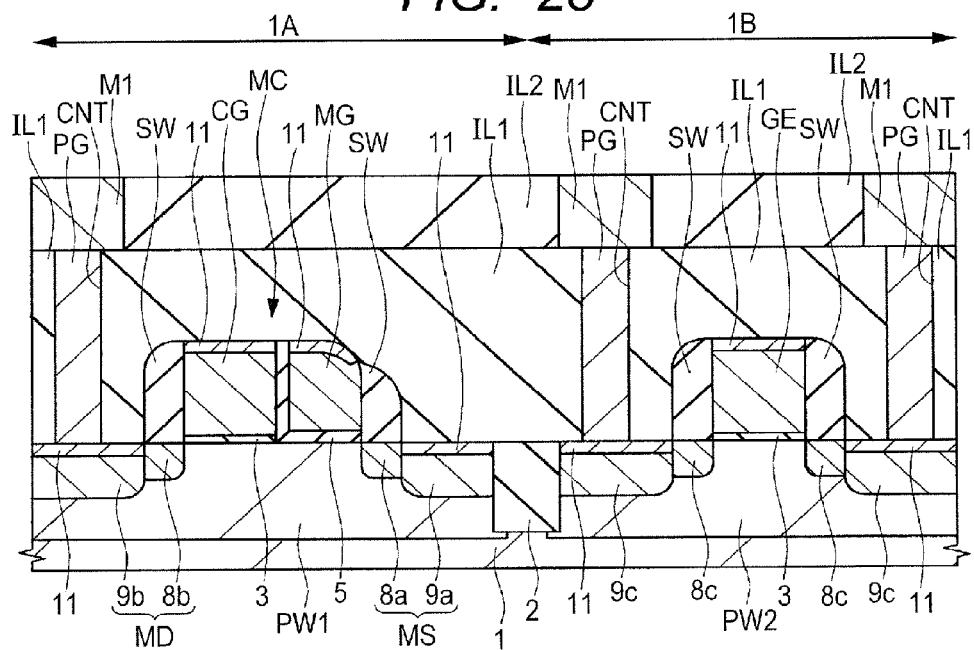
FIG. 28 is a cross-sectional view of a main part of a manufacturing step of the semiconductor device, following the step shown in FIG. 27.

As shown in FIG. 28, first, an insulating film IL2 is formed over the interlayer insulating film IL1 with the plugs PG embedded therein. The insulating film IL2 can be formed of a lamination of a plurality of insulating films. Then, a wiring trench (trench for the wiring) is formed in a predetermined region of the insulating film IL2 by dry etching using a photoresist pattern (not shown) as an etching mask. Then, a barrier conductive film (for example, a titanium nitride film, a tantalum film, or a tantalum nitride film) is formed over the insulating film IL2 including the bottom and sidewalls of the wiring trench. A copper seed layer is then formed over the barrier conductive film by the CVD or sputtering, and further a copper plating film is formed over the seed layer by an electrolytic plating or the like to fill the wiring trench with the copper plating film. Then, the main conductive film (copper plating film and seed layer) and the barrier conductive film in a region other than the wiring trench are removed by the CMP method to thereby form the first layer wiring M1 comprised of copper embedded in the wiring trench as a main conductive material. For easy understanding, FIG. 28 shows integration of the barrier conductive film, the seed layer, and the copper plating film as the wiring M1.

The wiring M1 is electrically coupled to the source (semiconductor region MS) of the memory transistor, the drain (semiconductor region MD) of the control transistor, the source/drain region (n+-type semiconductor region 9c) of the MISFET in the peripheral circuit region 1B, the control gate electrode CG, the memory gate electrode MG, or the gate electrode GE. Thereafter, the second or later wiring will be formed by the dual damascene method or the like, and the illustration and description thereof will be omitted below. The wiring M1 and upper layer wiring thereover are not limited to a damascene wiring, but can also be formed by patterning a conductive film for wiring, for example, of a tungsten wiring or an aluminum wiring.

In the way described above, the semiconductor device of this embodiment is manufactured.

Now, the arrangement and effects of this embodiment will be described below in more detail with reference to a comparative example.

Figure 29:
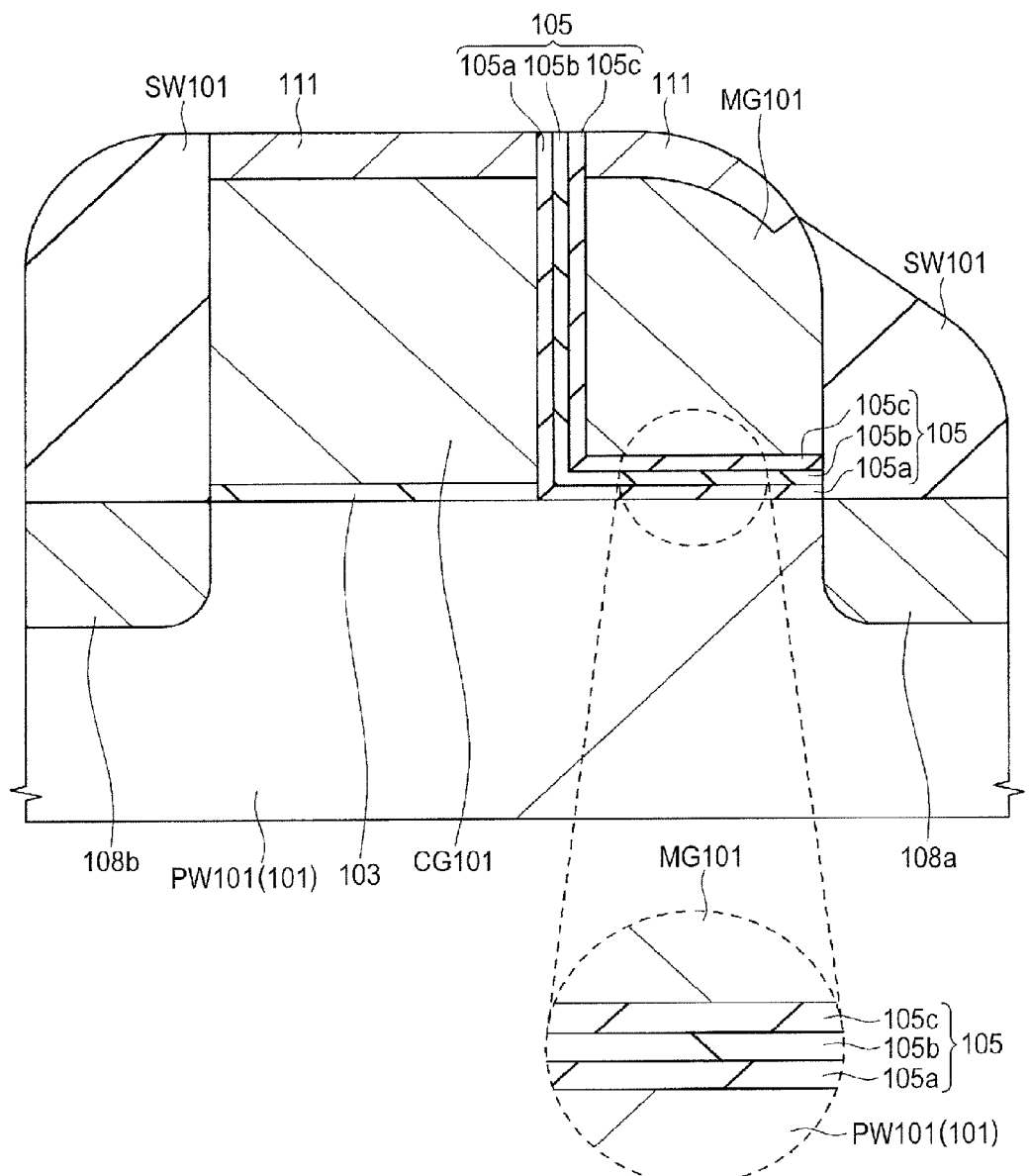
FIG. 29 is a cross-sectional view of a main part of a semiconductor device in a comparative example.

A semiconductor device of the comparative example, first, will be described below. FIG. 29 shows a cross-sectional view of a main part of the semiconductor device in the comparative example, corresponding to FIG. 2 of the present embodiment.

The semiconductor device of the comparative example shown in FIG. 29 is a semiconductor device with a memory cell of a nonvolatile memory. The semiconductor device includes a control gate electrode CG101 and a memory gate electrode MG101 which are arranged adjacent to each other over a p-type well PW101 of the semiconductor substrate 101 to form the nonvolatile memory cell. An insulating film 103 is formed as a gate insulating film between the control gate electrode CG101 and the p-type well PW101. An insulating film 105 is formed between the memory gate electrode MG 101 and the p-type well PW101, and between the control gate electrode CG101 and the memory gate electrode MG101. The insulating film 105 is comprised of a lamination of a silicon oxide film 105a, a silicon nitride film 105b, and a silicon oxide film 105c. The control gate electrode CG101 and the memory gate electrode MG101 each are formed of an n-type polysilicon film, over which a metal silicide layer 111 is formed. A sidewall insulating film SW101 is formed over the sidewall on the side opposite to the side where the control gate electrode CG101 and the memory gate electrode MG 101 are adjacent to each other. The p-type well PW101 is provided with an n-type semiconductor region for the source including the n⁻-type semiconductor region 108a, and another n-type semiconductor region for the drain including the n⁻-type semiconductor region 108b.

In the semiconductor device of the comparative example shown in FIG. 29, the insulating film 105 is comprised of a lamination of a silicon oxide film 105a, a silicon nitride film 105b over the silicon oxide film 105a, and a silicon oxide film 105c over the silicon nitride film 105b. That is, the insulating film 105 is the so-called oxide-nitride-oxide (ONO) film. The comparative example does not include any element corresponding to the metal dots 6 of this embodiment.

In the semiconductor device of the comparative example shown in FIG. 29, the silicon nitride film 105b of the insulating film 105 serves as a charge storage portion. The charges are stored in the silicon nitride film 105b of the insulating film 105, so that information is stored. The threshold voltage of the memory transistor is changed by the charges stored in the silicon nitride film 105b of the insulating film 105, which can distinguish between the writing state and the erasing state (to read the information).

When the silicon nitride film 105b of the insulating film 105 has a small density (surface density) of charges storable therein, the number of the storable charges becomes small, which results in a small difference between the threshold voltage of the memory transistor in the writing state and the threshold voltage of the memory transistor in the erasing state. In order to improve the electric performance of the nonvolatile memory, the large difference between the threshold voltage in the writing state and the threshold voltage in the erasing state is preferable. For this reason, the gate insulating film (insulating film 105 in the comparative example, or insulating film 5 in this embodiment) of the memory transistor is desired to have a high density (surface density) of the storable charges.

However, in recent years, memory cells have been reduced in size, leading to a decrease in thickness of a gate insulating film of a memory transistor. The decrease in thickness of the insulating film 105 as the gate insulating film of the memory transistor also decreases the thickness of the silicon nitride film 105b. Further, the decrease in thickness of the silicon nitride film 105b might decrease the density (surface density) of charges storable in the silicon nitride film 105b of the insulating film 105.

Specifically, when the thickness of the silicon nitride film 105b is more than 5 nm, a trap density of electrons is about $1 \times 10^{13}/cm^2$ at an interface between the silicon nitride film 105b and the silicon oxide film 105a and at an interface between the silicon nitride film 105b and the silicon oxide film 105c. And, two electrons per square centimeter can be stored in the direction of thickness. Thus, the electrons can be trapped at a density of $2 \times 10^{13}/cm^2$ in total. It is noted that when the thickness of the silicon nitride film 105b of the insulating film 105 is about more than 5 nm, the silicon nitride film 105b can store two electrons per square centimeter in the thickness direction, while when the thickness of the silicon nitride film 105b of the insulating film 105 is equal to or less than about 5 nm, two electrons cannot be stored in the thickness direction (that is, in this case, one electron can be stored in the thickness direction, but two electrons cannot be stored). When the thickness of the silicon nitride film 105b of the insulating film 105 is equal to or less than 5 nm, the number of electrons that can be trapped in the silicon nitride film 105b is sharply decreased, which drastically decreases the density (surface density) of the charges storable in the insulating film 105.

In contrast, in this embodiment, the insulating film 5 serving as the gate insulating film of the memory transistor includes the silicon oxide film 5a, the silicon nitride film 5b over the silicon oxide film 5a, and the silicon oxide film 5c over the silicon nitride film 5b. Further, the metal elements M (specifically, metal dots 6 comprised of the metal elements M) exist between the silicon nitride film 5b and the silicon oxide film 5c. That is, in the insulating film 5, the metal elements M are introduced into a space (interface) between the silicon nitride film 5b and the silicon oxide film 5c at a surface density of $1 \times 10^{13}$ to $2 \times 10^{14}$ atoms/cm². Specifically, the metal dots 6 comprised of the metal element M are arranged (formed). The metal element M is preferably, for example, titanium (Ti), nickel (Ni), tungsten (W), or tantalum (Ta), and more preferably, titanium (Ti).

In the insulating film 5 of this embodiment, the metal elements M are introduced into the space (interface) between the silicon nitride film 5b and the silicon oxide film 5c at the surface density of $1 \times 10^{13}$ to $2 \times 10^{14}$ atoms/cm². The deposition of the metal elements M over the silicon nitride film 5b at the surface density of $2 \times 10^{14}$ atoms/cm² is insufficient for one atomic layer, which cannot form a metal layer continuously formed in a planar manner (metal atomic layer). That is, in order to form the one atomic layer, the metal elements M have to be deposited at a surface density of more than $2\times10^{14}$ atoms/cm. When the metal elements M are deposited at the surface density of $2\times10^{14}$ atoms/cm$^2$ or less, the deposited metal atoms do not form a layer (layered shape continuously formed in a planar manner), and exist in the form of dots.

In this embodiment, the metal elements M are introduced into between the silicon nitride film 5b and the silicon oxide film 5c at the surface density of $1\times10^{13}$ to $2\times10^{14}$ atoms/cm$^2$, which is much smaller than a surface density required to form one atomic layer. Thus, the metal dots 6 are dispersed over the surface (upper surface) of the silicon nitride film 5b without forming a continuous film (layer) of metal atoms (atoms of the metal element M) in a planar manner. The individual metal dot 6 can serve as a charge storage portion, so that one metal dot 6 can store one electron. In this way, the silicon nitride film 5b of the insulating film 5 can serve as the charge storage portion, and also the metal dots 6 thereof can serve as another charge storage portion, which can enhance the density (surface density) of the charges storable in the insulating film 5. That is, as compared to the semiconductor device of the comparative example shown in FIG. 29, the semiconductor device of this embodiment has a high upper limit of the surface density of charges storable in the gate insulating film (corresponding to the insulating films 5 and 105) of the memory transistor by an amount of charges stored by the metal dots 6 as the charging storage portion (that is, by charges storable by the metal dots 6).

In the insulating film 5 of this embodiment, not only the silicon nitride film 5b but also the metal dots 6 can serve as the charge storage portion to increase the surface density of the charges storable in the insulating film 5 (that is, to increase the number of charges storable), which can result in a large difference between the threshold voltage of the memory transistor in the writing state and the threshold voltage of the memory transistor in the erasing state. This arrangement can improve the performance (electrical performance) of the semiconductor device with the nonvolatile memory, including easy reading of stored information from the memory cell MC.

As mentioned above, in recent years, memory cells have been reduced in size, leading to a decrease in thickness of the gate insulating film (corresponding to the insulating films 5 and 105) of the memory transistor, which leads to a decrease in thickness of the silicon nitride film (corresponding to the silicon nitride film 5b and 105b) of the gate insulating film of the memory transistor. Further, this leads to reduction in surface density of the charges storable in the silicon nitride film (corresponding to the silicon nitride films 5b and 105b). In this embodiment, however, not only the silicon nitride film 5b but also the metal dots 6 can serve as the charge storage portion. Even when the silicon nitride film 5b is so thin that the density of charges storable in the silicon nitride film 5b is decreased, the metal dots 6 can store the charges, which can compensate for the decrease in density (surface density) of the charges storable in the entire insulating film 5.

That is, in this embodiment, even when the insulating film 5 becomes thin to decrease the thickness of the silicon nitride film 5b, both the silicon nitride film 5b and the metal dots 6 can serve as the charge storage portion. Thus, the surface density of the charges storable in the insulating film 5 can be increased, which results in a large difference between the threshold voltage of the memory transistor in the writing state and the threshold voltage of the memory transistor in the erasing state. This arrangement can achieve the decrease in thickness of the insulating film 5 to reduce the size of the memory cell, while holding the performance of the nonvolatile memory. Therefore, this embodiment can achieve both the improvement of the performance (electric performance) of the nonvolatile memory and the reduction in size of the memory cell. That is, this embodiment can achieve both the improvement of the performance of the semiconductor device with the nonvolatile memory and the reduction in size of the semiconductor device.

Unlike this embodiment, not the metal dots 6, but silicon dots comprised of silicon are supposed to be formed between the silicon nitride film 5b and the silicon oxide film 5c. In this case, the silicon dots can store charges. The use of the silicon dots, however, has the following problems.

That is, in the use of the silicon dots, the size (grain size) of the individual silicon dot tends to become large. For example, the grain size of the silicon dot might be in a range of about 5 to 10 nm. The larger the grain size of the silicon dot, the smaller the surface density of the silicon dot, which makes it difficult to increase the surface density of storable charges. That is, the larger the grain size of the silicon dot, the smaller the surface density of the silicon dots becomes smaller. Since the number of silicon dots per memory cell is decreased, the number of charges storable in each memory cell is difficult to increase by use of the silicon dots. Even if the grain size of the silicon dot can become smaller, the silicon dots having a small grain size are likely to be oxidized in deposition of the silicon oxide film (corresponding to the silicon oxide film 5c) for covering the silicon dots. The silicon dots becomes the same type of silicon oxide as that of the silicon oxide film (corresponding to the silicon oxide film 5c), which does not function as a charge trapping means. Thus, the use of the silicon dots makes it difficult to sufficiently increase the surface density of storable charges.

In contrast, this embodiment uses the metal dots 6 comprised of the metal elements M (preferably Ti, Ni, W, or Ta), and thus can easily decrease the size (grain size) of the metal dots 6. Even when the metal dots 6 are oxidized in deposition of the silicon oxide film 5c, the trapping level can be formed, so that the charges can be trapped (stored) in the dots. Thus, in the use of the metal dots 6, the surface density of the storable charges can be surely increased.

Figure 30:
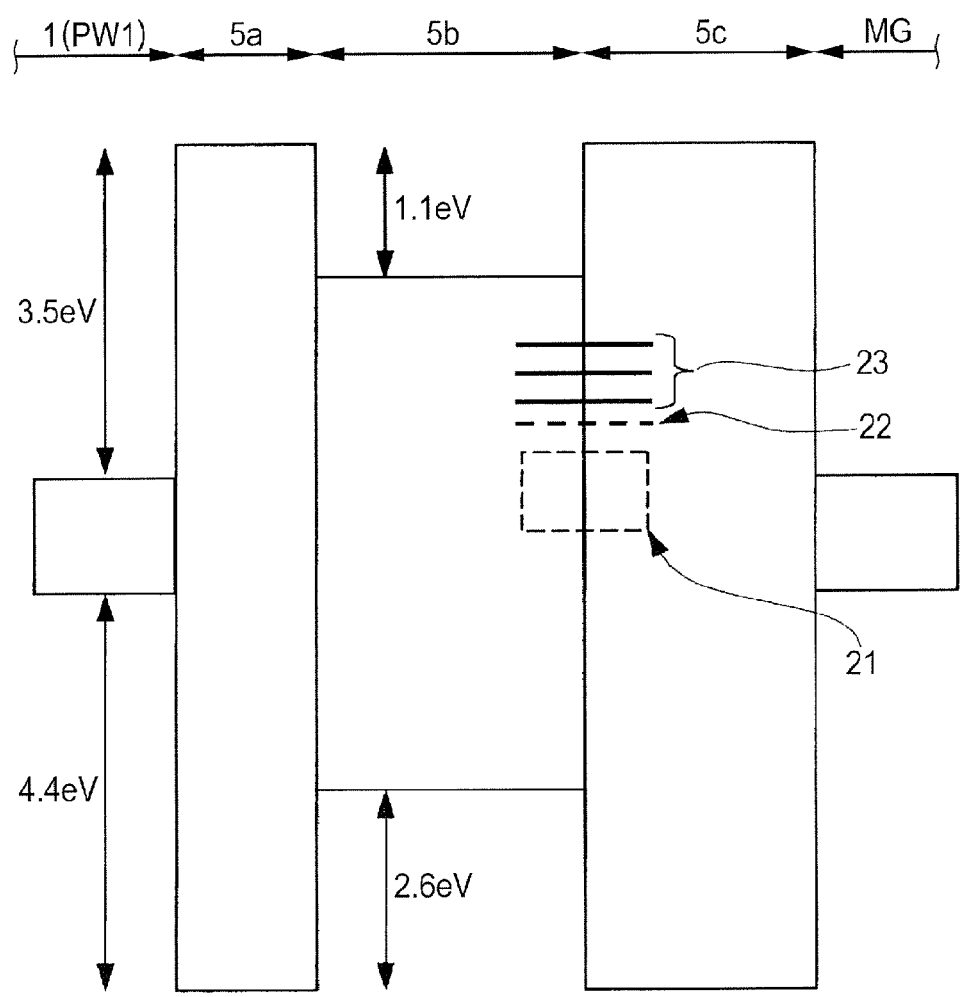
FIG. 30 is an energy band diagram from a semiconductor substrate to a memory gate electrode.

FIG. 30 is an energy band diagram of a laminated structure of the semiconductor substrate 1 (p-type well PW1), the insulating film 5, and the memory gate electrode MG, showing an energy band in the thickness direction (direction substantially perpendicular to the main surface of the semiconductor substrate 1). In FIG. 30, the lateral direction corresponds to the position of the lamination of the semiconductor substrate 1 (p-type well PW1), the insulating film 5, and the memory gate electrode MG in the direction of thickness, and the longitudinal direction corresponds to the energy. FIG. 30 corresponds to the energy band in formation of titanium dots (metal dots 6 comprised of titanium) as the metal dot 6. In FIG. 30, reference character 21 indicates a band gap of titanium (Ti), and reference character 22 indicates an electron trapping level of titanium (Ti). Further, in FIG. 30, reference character 23 indicates an electron trapping level of the titanium dots (corresponding to the metal dots 6 comprised of titanium) due to crystal defects or surface shape of the dots.

As can be seen from FIG. 30, the band gap of the silicon nitride film 5b is smaller than that of each of the silicon oxide films 5a and 5c, so that the potential barrier height of the silicon oxide films 5a and 5c is higher than that of the silicon nitride film 5b. Thus, the silicon nitride film 5b can store the charges.

The titanium dot (corresponding to the metal dots 6 comprised of titanium) is formed in a space (at an interface) between the silicon nitride film 5b and the silicon oxide film 5c, so that trapping levels are newly formed at the interface between the silicon nitride film 5b and the silicon oxide film 5c at an energy level above the band gap of titanium. The trapping levels include an electron trapping level 23 due to the crystal defect or surface shape of the titanium dots (metal dots 6 comprised of titanium), and the electron trapping level 22 of titanium (Ti). The electrons are trapped in the trapping levels (electron trapping levels 22 and 23) newly formed by the titanium dots (corresponding to the metal dots 6 comprised of titanium), which can increase the number of electrons (density of electrons) trapped (stored) in the insulating film 5.

The energy band structure in the comparative example shown in FIG. 29 is one obtained by subtracting the band gap 21 of titanium and the electron trapping levels 22 and 23 from the energy band shown in FIG. 30. However, in this embodiment, the formation of titanium dots (corresponding to the metal dots 6 comprised of titanium) form the new trapping levels, such as the electron trapping levels 22 and 23, in which electrons are trapped, thereby increasing the number of electrons (density of the electrons) trapped (stored) in the insulating film 5.

The metal element M (specifically, metal element M forming the metal dots 6) introduced into between the silicon nitride film 5b and the silicon oxide film 5c is preferably a metal element whose oxide has a small band gap. This is because even when the metal element M introduced into between the silicon nitride film 5b and the silicon oxide film 5c (specifically, the metal dots 6 comprised of the metal element M) is oxidized in deposition of the silicon oxide film 5c, the trapping level can be ensured. For example, when titanium dots (corresponding to the metal dots 6 comprised of titanium) are used as the metal dots 6, even if the titanium dots are oxidized in deposition of the silicon oxide film 5c, the band gap of the titanium oxide (typified by $TiO_2$) is very low, for example, about 3.5 eV (as compared to the band gap of the silicon nitride of about 5.3 eV, and the band gap of the silicon oxide of about 9 eV). The band gap of the titanium oxide is equal to or less than that of the silicon nitride, which can form the trapping level of electrons.

For this reason, the kind of the metal element M is preferably selected such that the band gap of the oxide of the metal element M is smaller than the band gap of the silicon oxide (of about 9 eV) and is equal to or less than the band gap (of about 5.3 eV) of the silicon nitride. Regardless of the oxidation of the metal element M introduced into between the silicon nitride film 5b and the silicon oxide film 5c (specifically, the metal dots 6b comprised of the metal element M) in deposition of the silicon oxide film 5c, the trapping level can be formed, so that the metal elements M introduced (metal dots 6) can serve as the charge storage portion. This arrangement can surely increase the number of electrons (surface density of electrons) that can be trapped (stored) in the insulating film 5, and thus can surely improve the performance (electric performance) of the semiconductor device with the nonvolatile memory. From this aspect, the metal element M is preferably, titanium (Ti), nickel (Ni), tungsten (W), or tantalum (Ta), and more preferably titanium (Ti). The band gap of the nickel oxide is in a range of about 3.5 to 4 eV. The band gap of the tungsten oxide ($WO_3$) is in a range of about 2.4 to 2.8 eV. The band gap of the tantalum oxide is about 4.4 eV.

Titanium (Ti), nickel (Ni), tungsten (W), and tantalum (Ta) are metals used in the manufacturing process of the semiconductor device. The use of these metals as the metal dots 6 advantageously have no inconvenience in the manufacturing steps.

In this embodiment, the metal dots 6 are formed over the silicon nitride film 5b as the charge storage layer (that is, between the silicon nitride film 5b and the silicon oxide film 5c), so that the trapping level of electrons is newly formed at the interface between the silicon oxide film 5c and the silicon nitride film 5b, which can increase the number of electrons storable in the insulating film 5. This arrangement can enlarge a difference between the threshold voltage of the memory transistor in the writing state and the threshold voltage of the memory transistor in the erasing state, which can improve the performance (electric performance) of the semiconductor device.

In the insulating film 105 of the ONO structure in the semiconductor device of the comparative example shown in FIG. 29, silicon-silicon bonding, silicon-nitrogen bonding, and silicon-oxygen bonding are cut at the interface between the silicon nitride film 105b and the silicon oxide film 105c, so that the trap (trapping level) is formed at a non-bonded part. In contrast, in this embodiment, the metal dots 6 can exist regardless of the non-bonded part, so that the amount of trapping of electrons can be increased by the amounts of added metal dots 6. That is, in this embodiment, the trapping of electrons by the metal dots 6 can be added without decreasing the trapping of electrons by the silicon nitride film 5b, which can effectively increase the number of electrons storable in the insulating film 5. This arrangement can surely enlarge the difference between the threshold voltage of the memory transistor in the writing state and the threshold voltage of the memory transistor in the erasing state, thereby surely improving the performance (electric performance) of the semiconductor device.

In this embodiment, the metal dots 6 are formed (arranged) between the silicon nitride film 5b and the silicon oxide film 5c. Thus, the metal dots 6 are distributed over the silicon nitride film 5b between the semiconductor substrate 1 (p-type well PW1) and the memory gate electrode MG in the two-dimensional manner at the substantially uniform height by a distance from the semiconductor substrate 1 (p-type well PW1). The threshold voltage shift of the transistor largely depends on the distance from the substrate to the stored charges as well as the amount of stored charges. However, in this embodiment, the metal dots 6 are distributed over the silicon nitride film 5b at the substantially uniform height from the semiconductor substrate 1 (p-type well PW1), which can suppress the variations in shift of the threshold voltage.

Unlike this embodiment, the following case is assumed. The formation of the silicon nitride film 5b is omitted, and the insulating film 5 is formed of a silicon oxide film 5a, metal dots 6 formed over the silicon oxide film 5a, and a silicon oxide film 5c formed over the silicon oxide film 5a to cover the metal dots 6. When the formation of the silicon nitride film 5b is omitted, however, parts of metal material forming the metal dots 6 might be diffused into the silicon oxide film 5a by heat treatment (activation anneal in step S16, for example) after the formation process of the insulating film 5. Thus, electrons stored in the insulating film 5 (metal dots 6 thereof) are likely to be pulled away into the substrate (semiconductor substrate 1) side. The distance from the substrate (semiconductor substrate 1) to the metal dots 6 becomes non-uniform, which leads to variations in shift of the threshold voltage. Thus, the silicon nitride film 5b is preferably formed, like this embodiment.

In this embodiment, the metal dots 6 are formed (arranged) into between the silicon nitride film 5b and the silicon oxide film 5c, so that the silicon nitride film 5b intervenes in between the metal dots 6 and the silicon nitride film 5a with the metal dots 6 not being in contact with the silicon nitride film 5a. This arrangement can prevent the metal elements forming the metal dots 6 from diffusing into the silicon oxide film 5a by the heat treatment after the formation process of the insulating film 5 (for example, activation anneal in step S16). Thus, the electrons stored in the insulating film 5 (metal dots 6 thereof) can be prevented from being taken out into the substrate (semiconductor substrate 1) side. The distance from the substrate (semiconductor substrate 1) to the metal dots 6 becomes uniform, which can prevent the variations in shift of the threshold voltage.

The part of metal elements forming the metal dots 6 reach (are diffused into) the substrate (semiconductor substrate 1) by the heat treatment after the formation process of the insulating film 5 (for example, by the activation anneal in step S16), which might affect the channel region. For this reason, it is preferable to prevent the part of the metal elements forming the metal dots 6 from reaching (being diffused into) the substrate (semiconductor substrate 1), as much as possible. In this embodiment, the formation of the silicon nitride film 5b can suppress or prevent the diffusion of the metals elements of the metal dots 6 into the substrate (semiconductor substrate 1). This embodiment can prevent the metal elements of the metal dots 6 from affecting the channel region, and thus can improve the reliability and performance (electric performance) of the semiconductor device.

The diffusion of the metal elements of the metal dots 6 into the substrate (semiconductor substrate 1) affects the channel region. The degree of the influence on the channel region is very large. As compared to this case, the diffusion of the metal elements of the metal dots 6 into the memory gate electrode MG relatively little affects the channel region. Thus, the silicon oxide film 5c can be formed over the silicon nitride film 5b to cover the metal dots 6.

In order to prevent the diffusion of the metal elements of the metal dots 6 which might cause variations in distance from the substrate (semiconductor substrate 1) to the metal elements, the silicon nitride film 5b preferably forms a sufficient film (continuous film continuously formed in a planar manner). The thickness of the silicon nitride film 5b is preferably set to such a value that can surely prevent the diffusion of the metal elements forming the metal dots 6 into the substrate (semiconductor substrate 1) side by the presence of the silicon nitride film 5b. From this point of view, the thickness of the silicon nitride film 5b is more preferably equal to or more than 2 nm.

As described above, when the thickness of the silicon nitride film 105b of the insulating film 105 is equal to or less than 5 nm, the trapping density of electrons by the silicon nitride film 105b is reduced, which drastically decreases the number of electrons that can be trapped in the silicon nitride film 105b. Thus, in the semiconductor device in the comparative example shown in FIG. 29, the decrease in thickness of the silicon nitride film 105b of the insulating film 105 down to 5 nm or less leads to a decrease in density of storable charges, which might result in a small difference between the threshold voltage of the memory transistor in the writing state and the threshold voltage of the memory transistor in the erasing state. In contrast, in this embodiment, both the silicon nitride film 5b and the metal dots 6 can serve as the charge storage portion. Even when the thickness of the silicon nitride film 5b of the insulating film 5 is reduced to 5 nm or less, the decrease in density of the charges storable in the silicon nitride film 5b can be compensated for by the storage of the charges in the metal dots 6. When the silicon nitride film 5b is intended to be thinned, this embodiment can be applied to the case where the thickness of the silicon nitride film 5b is equal to or less than 5 nm, which is a great effect.

Thus, in this embodiment, the thickness of the silicon nitride film 5b is most preferable in a range of 2 to 5 nm. Setting the thickness of the silicon nitride film 5b in such a range can compensate for the shortage of the trapping density of electrons in the silicon nitride film 5b by the increase in trapping density of electrons by provision of the metal dots 6 (for example, increase in trapping density by about $1 \times 10^{12}$ to $4 \times 10^{13}/\text{cm}^2$).

The metal dot 6 is formed of a small amount of metal atoms at a surface density of $1 \times 10^{13}$ to $2 \times 10^{14}/\text{cm}^2$. Even when the metal dots 6 are formed in the insulating film 5, the increase in thickness of the insulating film 5 can be prevented. Thus, the surface density of charges storable in the insulating film 5 can be improved by formation of the metal dots 6 in the insulating film 5 without increasing the thickness of the insulating film 5.

Unlike this embodiment, when the metal elements are deposited over the silicon nitride film 5 in step S7c, for example, when the titanium (Ti) elements are deposited in a thickness of 0.5 nm (corresponding to a surface density of $2.8 \times 10^{15}$ atoms/cm$^2$), the deposited titanium (Ti) elements might form the film (continuous film continuously formed in a planar manner). In this case, the insulating film 5 is comprised of a lamination of the silicon oxide film 5a, the silicon nitride film 5b thereover, the titanium film thereover, and the silicon oxide film 5c thereover with the titanium film formed between the silicon nitride film 5b and the silicon oxide film 5c. However, when the titanium film is formed between the silicon nitride film 5b and the silicon oxide film 5c, like the use of the polysilicon as a floating gate, a tunneling oxide film (corresponding to the silicon oxide film 5a) or a top oxide film (corresponding to the silicon oxide film 5c) might be thinned to cause the leak path due to defects of the oxide film. As a result, all trapped electrons (all electrons stored in the titanium film) might leak through the leak path. That is, when the titanium film is formed between the silicon nitride film 5b and the silicon oxide film 5c with even one leak path leading to the titanium film, all charges stored in the titanium film would leak through the leak path. This results in diminishing of information stored in the memory cell, reducing the reliability of the semiconductor device.

In contrast, in this embodiment, when the metal elements M are deposited over the silicon nitride film 5 in step S7c, the metal elements M are deposited at a surface density smaller than the surface density required to form the film (continuous film continuously formed in a planar manner). Specifically, the metal elements M are deposited over the silicon nitride film 5b at a surface density of $2 \times 10^{14}$ atoms/cm$^2$ or less. Thus, in this embodiment, even when the metal elements M are deposited over the silicon nitride film 5 in step S7c, dot-like metal dots 6 are diffused in the two-dimensional manner over the silicon nitride film 5b without forming the film comprised of the metal elements M (continuous film continuously formed in the planar manner), so that the individual metal dots cannot be coupled together. Thus, even when leak paths are caused due to defects in the silicon oxide film 5a or silicon oxide film 5c, some electrons trapped in the metal dots 6 in contact with the leak path may leak through the leak path, but other electrons trapped in other metal dots 6 (that is, metal dots 6 positioned not to be in contact with the leak path) do not leak. That is, the charges leak only from the metal dots 6 leading to the leak path, so that the metal dots 6 not leading to the leak path can hold the charges. This arrangement can suppress or prevent the movement or leak of the charges stored in the memory dots 6. This embodiment never lose the information stored in the memory cell (about the writing state or erasing state), and thus can improve the reliability of the semiconductor device.

The amount of deposition of the metal elements M onto the silicon nitride film 5b in step S7c is equal to or less than $2 \times 10^{14}$ atoms/cm$^2$, so that the dot-like metal dots 6 are diffused over the silicon nitride film 5b in a two-dimensional manner without making the film of the metal-element M (continuous film continuously formed in a planar manner) with the individual metal dots 6 not coupled together. Too small amounts of deposition of the metal elements M over the silicon nitride film 5b in step 7c decrease the surface density of the metal dots 6, which decreases the number of the metal dots 6 per memory cell. As a result, the effect of increasing the number of stored charges by addition of the metal dots 6 cannot be sufficiently exhibited. Further, the excessively small amount of deposition of the metal elements M over the silicon nitride film 5b in step S7c makes it difficult to control the deposition step of the metal elements M. Thus, the amount of deposition (surface density) of the metal elements M over the silicon nitride film 5b in step S7c is preferably equal to or more than $1 \times 10^{13}$ atoms/cm$^2$. This can provide sufficient effect of increasing the number of stored charges by addition of the metal dots 6, which facilitates the control of the deposition step of the metal elements M. Thus, the amount of deposition (surface density) of the metal elements M over the silicon nitride film 5b in step S7c is preferably not less than $1 \times 10^{13}$ atoms/cm$^2$ nor more than $2 \times 10^{14}$ atoms/cm$^2$.

The formation of the metal dots 6 by depositing the metal elements M over the silicon nitride film 5b in step S7c can be performed by the sputtering or ALD method, and preferably the sputtering. In use of the sputtering, the metal elements M are deposited at a surface density of about $1 \times 10^{13}$ to $2 \times 10^{14}$ atoms/cm$^2$ by adjusting the deposition time, which can form the metal dots 6 in the form of dot (at the level of several atoms) without forming the film (continuous film continuously formed in a planar manner). In this case, the metal dots 6 are dispersed over the silicon nitride film 5b at a density of about $1 \times 10^{12}$ to $4 \times 10^{13}$ atoms/cm$^2$. When a plurality of electrons exist in the fine metal dots 6, the distance between the electrons becomes small, which generates a strong Coulomb repulsion, so that one electron is stored in one metal dot 6 (that is, two or more electrons are not stored in one metal dot 6).

Second Embodiment

Figure 31:
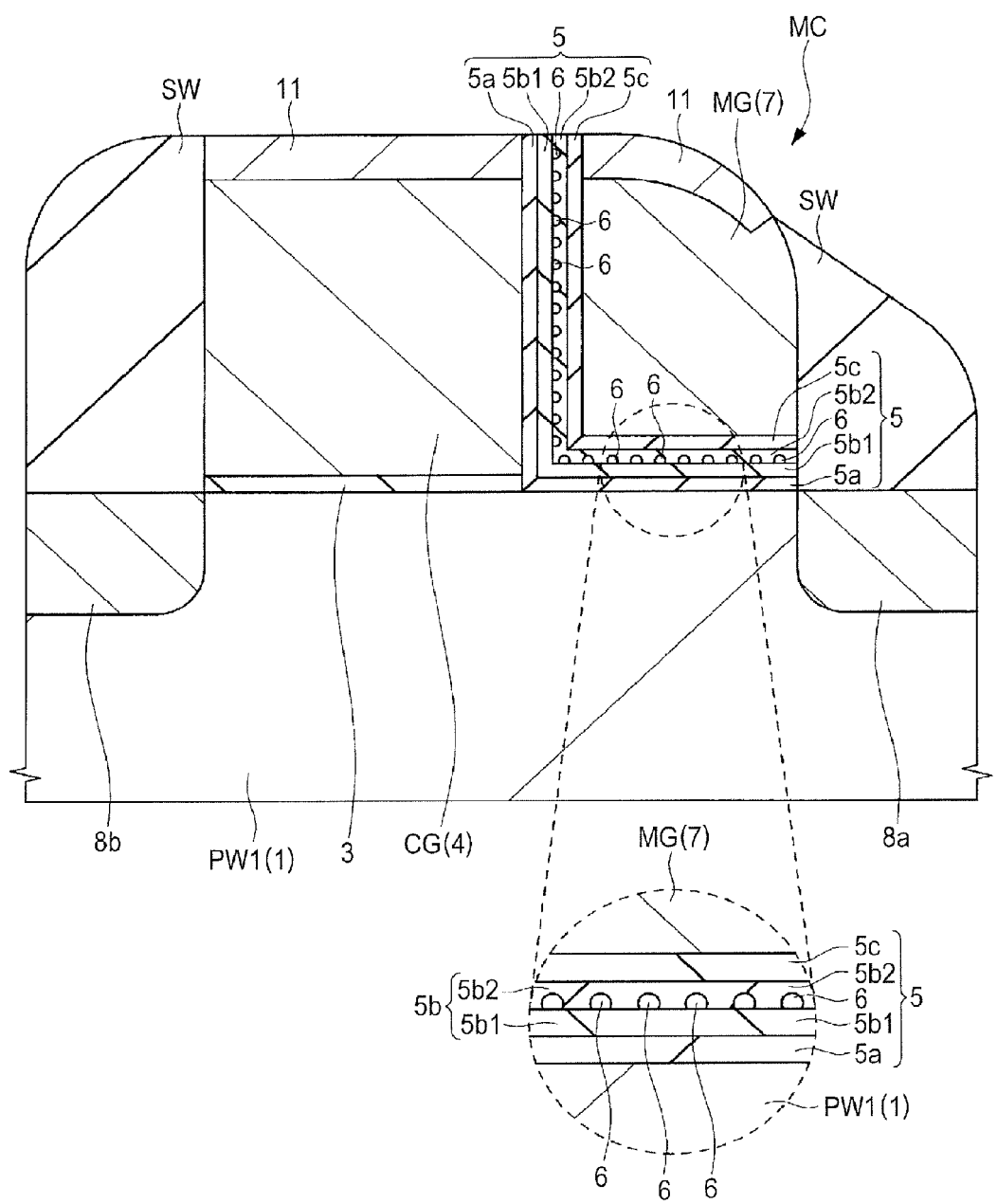
FIG. 31 is a cross-sectional view of a main part of a semiconductor device according to another embodiment of the invention.

FIG. 31 is a cross-sectional view of a main part of the semiconductor device of this embodiment, corresponding to FIG. 2 of the first embodiment.

The semiconductor device of the second embodiment is also a semiconductor device with a nonvolatile memory. FIG. 31 is a partial enlarged cross-sectional view of a memory cell MC in the semiconductor device of the second embodiment. The semiconductor device of the second embodiment differs from the semiconductor device of the first embodiment only in the insulating film 5. Now, only the insulating film 5 will be described below, and the repeated description of the structure except for the insulating film 5 will be omitted.

In the first embodiment, the insulating film 5 includes the silicon oxide film 5a, the silicon nitride film 5b thereover, and the silicon oxide film 5c thereover, and the metal elements M (more specifically, metal dots 6) exist between the silicon nitride film 5b and the silicon oxide film 5c.

In the second embodiment, as shown in FIG. 31, the insulating film 5 includes a silicon oxide film 5a, a silicon nitride film 5b1 thereover, a silicon nitride film 5b2 thereover, and a silicon oxide film 5c thereover. The metal elements M (more specifically, metal dots 6) exist between the silicon nitride film 5b1 and the silicon nitride film 5b2. The surface density of the metal elements M in the insulating film 5 in the second embodiment is the same as that in the first embodiment.

Figure 32:
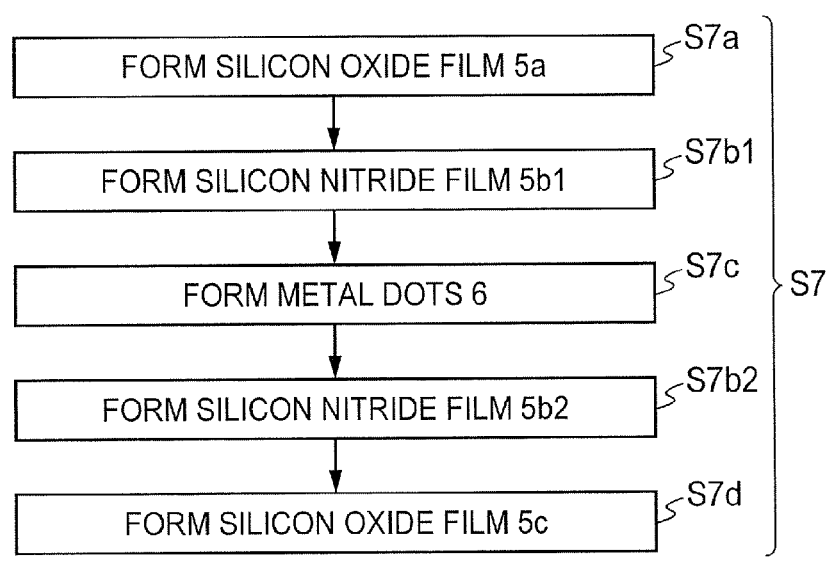
FIG. 32 is a process flowchart showing a part of a manufacturing process of the semiconductor device according to another embodiment of the invention.
Figure 33:
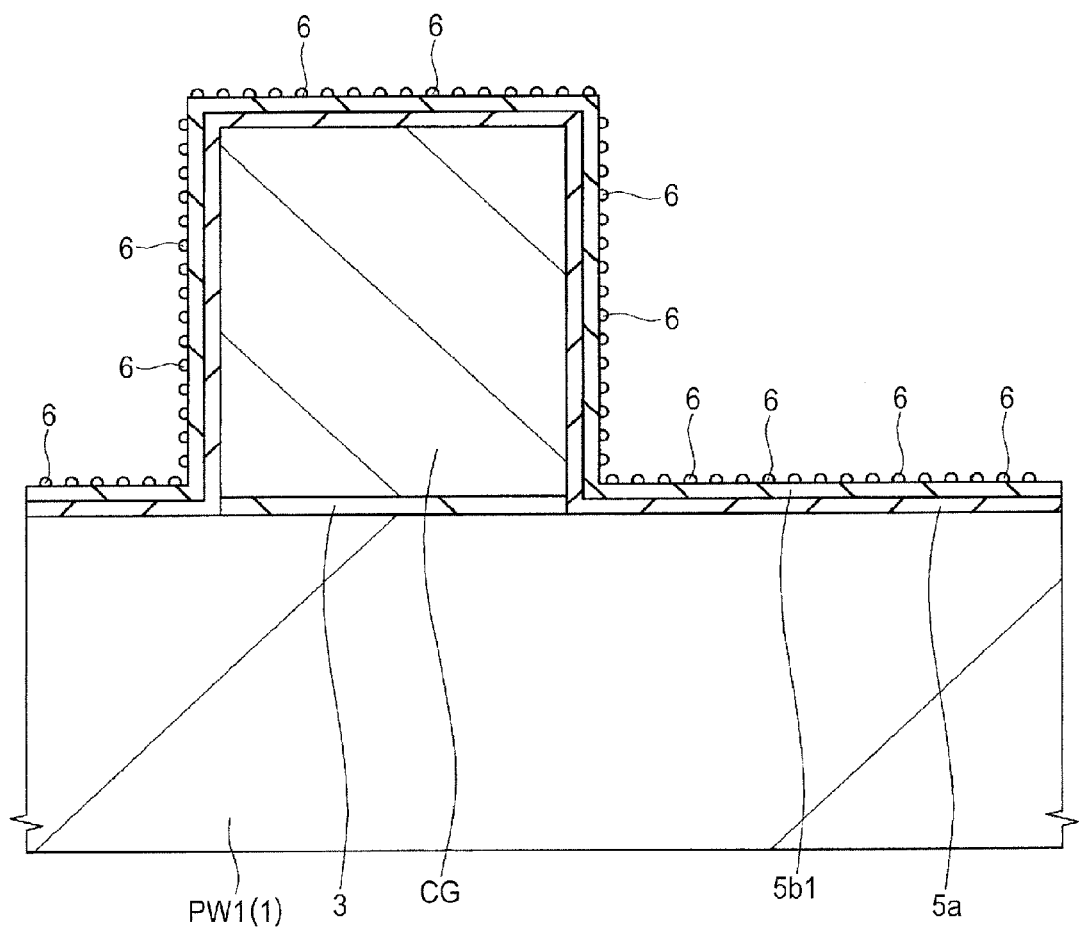
FIG. 33 is a cross-sectional view of a main part of a manufacturing step of the semiconductor device according to another embodiment of the invention.
Figure 34:
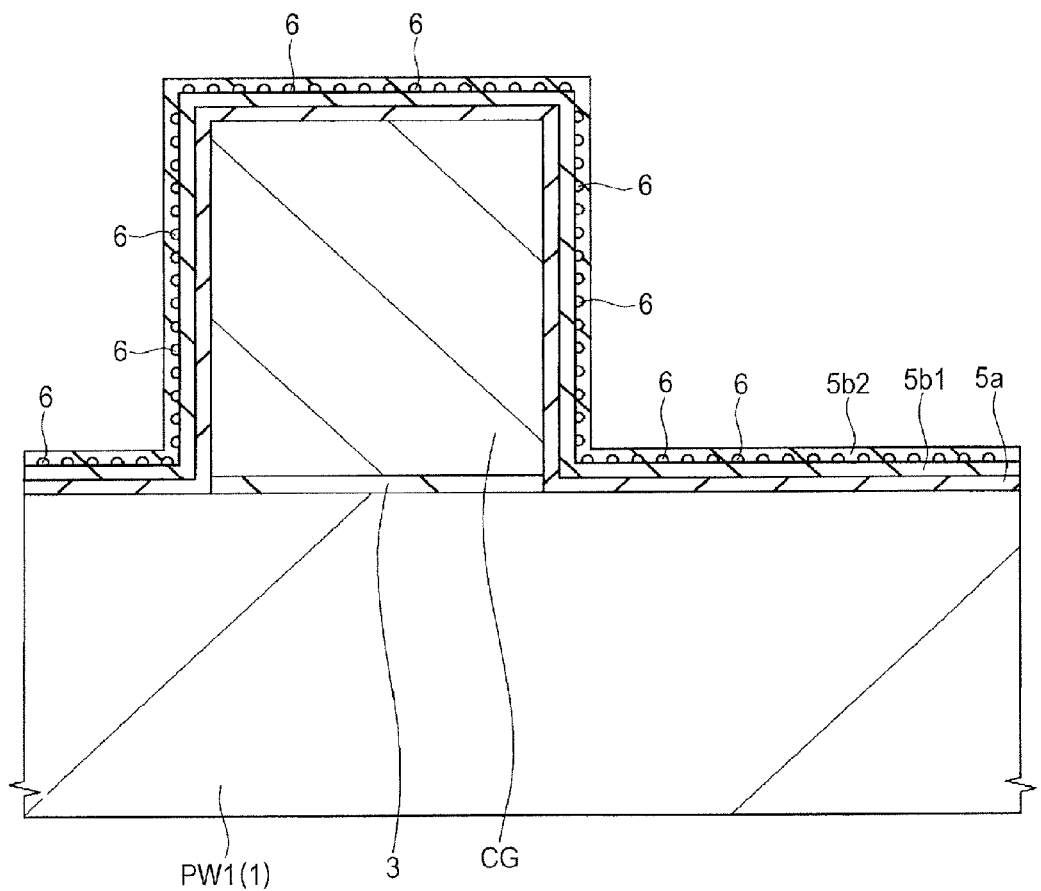
FIG. 34 is a cross-sectional view of a main part of a manufacturing step of the semiconductor device, following the step shown in FIG. 33.
Figure 35:
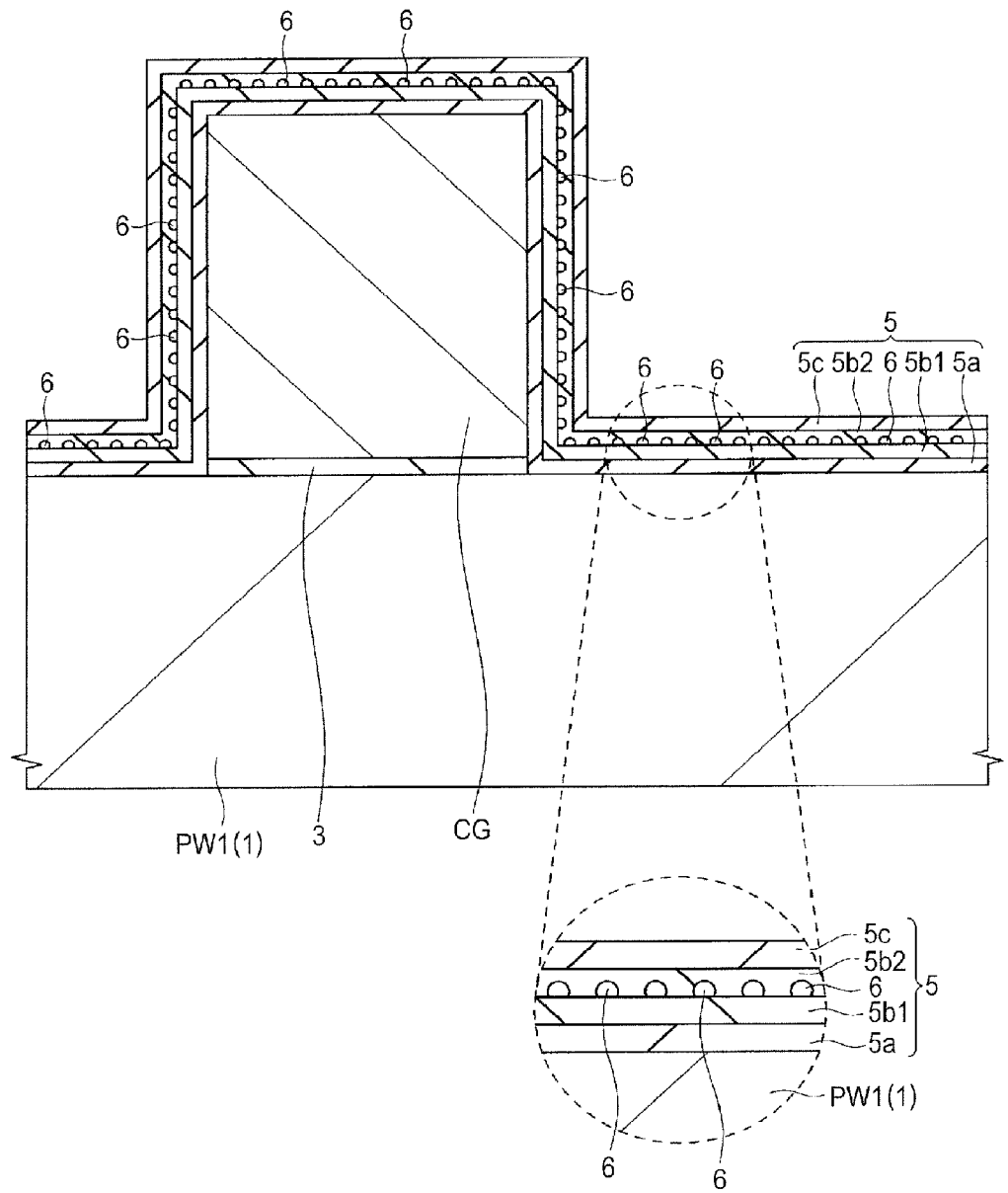
FIG. 35 is a cross-sectional view of a main part of a manufacturing step of the semiconductor device, following the step shown in FIG. 34.

FIG. 32 is a process flowchart showing a formation process of the insulating film 5 in the second embodiment, corresponding to FIG. 6 of the first embodiment. FIGS. 33 to 35 are cross-sectional views of main parts showing the formation process of the insulating film 5, corresponding to the cross sections of FIGS. 12 to 16 of the first embodiment.

In the second embodiment, the formation process of the insulating film 5 in step S7 can be carried out in the following way.

First, the process in step S7a is performed in the same way as the first embodiment. As shown in FIG. 33, the silicon oxide film 5a is formed (in step S7a of FIG. 32). The formation process of the silicon oxide film 5a in step S7a is the same as that of the first embodiment, and its repeated description will be omitted.

Then, the silicon nitride film 5b1 is formed over the silicon oxide film 5a (in step S7b1 shown in FIG. 32). The formation process of the silicon nitride film 5b1 in step S7b1 is basically the same as the formation process of the silicon nitride film 5b in step S7b of the first embodiment. The thickness (formation thickness) of the silicon nitride film 5b1 can be thinner than that of the silicon nitride film 5b of the first embodiment by the thickness of the silicon nitride film 5b2 to be formed later.

Then, the metal elements M are deposited over the silicon nitride film 5b1 to thereby form the metal dots 6 comprised of the metal elements M, over the silicon nitride film 5b1 (in step S7c in FIG. 32).

In step S7c, in the first embodiment, the metal elements M are deposited over the silicon nitride film 5b (that is, the metal dots 6 are formed over the silicon nitride film 5b), while in the second embodiment, the metal elements M are deposited over the silicon nitride film 5b1 (that is, the metal dots 6 are formed over the silicon nitride film 5b1). The first embodiment is basically the same as the second embodiment in step S7c, except for the above point. Thus, the repeated description of the step S7c will be omitted below.

Then, as shown in FIG. 34, the silicon nitride film 5b2 is formed over the silicon nitride film 5b1 to cover the metal dots 6 (in step S7b2 shown in FIG. 32). The formation process of the silicon nitride film 5b2 in step S7b2 can be performed in the substantially same way as the formation process of the silicon nitride film 5b1 in step S7b1.

Then, as shown in FIG. 35, the silicon oxide film 5c is formed over the silicon nitride film 5b2 (in step S7d shown in FIG. 32). In step S7d, in the first embodiment, the silicon oxide film 5c is formed to cover the metal dots 6 over the silicon nitride film 5b, and in the second embodiment, the silicon oxide film 5c is formed over the silicon nitride film 5b2. Except for the above point, the second embodiment is basically the same as the first embodiment in step S7d. Thus, the repeated description of the process in step S7d will be omitted below. The total thickness of the silicon nitride film 5b1 and the silicon nitride film 5b2 can be substantially the same as that of the above silicon nitride film 5b.

In the above-mentioned way, the insulating film 5 can be formed.

In the second embodiment, as shown in FIG. 31, the insulating film 5 includes the silicon oxide film 5a, the silicon nitride film 5b1 thereover, the silicon nitride film 5b2 thereover, and the silicon oxide film 5c thereover. The metal dots 6 are formed (arranged) between the silicon nitride film 5b1 and the silicon nitride film 5b2. That is, the combination of the silicon nitride film 5b1 and the silicon nitride film 5b2 can be regarded as the silicon nitride film 5b of the first embodiment. In the second embodiment, the insulating film 5 includes the silicon oxide film 5a, the silicon nitride film 5b over the silicon oxide film 5a, and the silicon oxide film 5c over the silicon nitride film 5b, with the metal dots 6 formed in the silicon nitride film 5b.

That is, the first embodiment and the second embodiment can be totally expressed as follows. That is, the insulating film 5 includes the silicon oxide film 5a, the silicon nitride film 5b over the silicon oxide film 5a, and the silicon oxide film 5c over the silicon nitride film 5b. The metal elements exist (are introduced) into between the silicon nitride film 5b and the silicon oxide film 5c (corresponding to the first embodiment), or into the silicon nitride film 5b (corresponding to the second embodiment), at a surface density of $1 \times 10^{13}$ to $2 \times 10^{14}$ atoms/cm$^2$. Specifically, the metal dots 6 comprised of the metal elements M are formed between the silicon nitride film 5b and the silicon oxide film 5c (corresponding to the first embodiment), or in the silicon nitride film 5b (corresponding to the second embodiment).

Also in the second embodiment, like the first embodiment, the charges can be stored in the metal dots 6 in addition to the silicon nitride film 5b. This arrangement can increase the surface density of charges stored in the insulating film 5, which can increase a difference between the threshold voltage of the memory transistor in the writing state and the threshold voltage of the memory transistor in the erasing state. Thus, this embodiment can also improve the performance (electric performance) of the semiconductor device with the nonvolatile memory.

The difference of the second embodiment from the first embodiment is whether the metal elements M (metal dots 6) exist between the silicon nitride film 5b and the silicon oxide film 5c (corresponding to the first embodiment), or in the silicon nitride film 5b (corresponding to the second embodiment). The above-mentioned first embodiment has the following advantages.

That is, in the first embodiment, after forming the silicon nitride film 5b in step S7b, the metal elements M are deposited in step S7c to form the metal dots 6. In the second embodiment after forming the silicon nitride film 5b1 in step S7b1, the metal elements M are deposited in step S7c to form the metal dots 6, and then the silicon nitride film 5b2 is formed thereover. Thus, the first embodiment is more advantageous than the second embodiment from the viewpoint of reduction in the number of steps in the manufacturing process.

When the thickness of the insulating film 5 in the first embodiment is the same as that of the second embodiment, the total thickness of the silicon nitride film 5b1 and the silicon nitride film 5b2 in the second embodiment is set to the same as that of the silicon nitride film 5b in the first embodiment. Thus, in the second embodiment, the thickness of each of the silicon nitride films 5b1 and 5b2 becomes so thin (for example, in about 1 to 2.5 nm). If the silicon nitride film is intended to be deposited thinly (for example, in about 2 nm or less), the thin silicon nitride film can hardly be stably deposited by a deposition device (for example, a LPCVD batch deposition device). Thus, the first embodiment is more advantageous from the viewpoint of stably depositing the silicon nitride film with ease.

Unlike the first embodiment and the second embodiment, when the metal dots 6 are formed in between the silicon oxide film 5a and the silicon nitride film 5b, the metal elements forming the metal dots 6 might diffuse into the semiconductor substrate 1 to affect the channel region. The first and second embodiments can suppress and prevent the diffusion of the metal elements forming the metal dots 6 into the semiconductor substrate 1 because of the presence of the silicon nitride film (silicon nitride film 5b in the first embodiment, or the silicon nitride film 5b1 in the second embodiment) directly under the metal dots 6. In order to prevent the metal elements forming the metal dots 6 from diffusing into the semiconductor substrate 1 (for example, channel region) as much as possible, the silicon nitride film directly under the metal dots 6 is preferably thick. When the total thickness of the silicon nitride film 5b1 and the silicon nitride film 5b2 in the second embodiment is the same as that of the silicon nitride film 5b in the first embodiment, the silicon nitride film directly under the metal dots 6 can be thickened in the first embodiment as compared to the second embodiment, which can more surely prevent the diffusion of the metal elements forming the metal dots 6 into the semiconductor substrate 1 (specifically, channel region). From this aspect, the first embodiment is more advantageous.

In the second embodiment, the metal elements M (metal dots 6) exist in the silicon nitride film 5b. This structure can also be obtained by diffusing the metal elements M deposited over the silicon nitride film 5b into the silicon nitride film 5b by using heat treatment. In this case (when thermally diffusing the metal elements M into the silicon nitride film 5b), it is difficult to make the distance from the metal element M in the silicon nitride film 5b to the substrate (semiconductor substrate 1) uniform, which might lead to variations. For this reason, as shown in FIGS. 32 to 35, the process in step S7b1 (formation process of the silicon nitride film 5b1), the process in step S7c (deposition step of the metal elements M), and the process in step S7b2 (formation process of the silicon nitride film 5b2) are more preferable in obtaining the structure with the metal elements M, rather than the thermal diffusion of the metal elements M into the silicon nitride film 5b.

The invention made by the inventors has specifically explained based on the embodiments. However, it is apparent that the invention is not limited to the disclosed embodiments, and various modifications and changes can be made to those embodiments without departing from the scope of the invention.

The present invention is effectively applied to semiconductor devices and manufacturing techniques thereof.

What is claimed is:
1. A manufacturing method of a semiconductor device, said semiconductor device including:
   a semiconductor substrate;
   first and second gate electrodes formed adjacent to each other over the semiconductor substrate;
   a first gate insulating film formed between the semiconductor substrate and the first gate electrode and having a charge storage portion therein; and a second gate insulating film formed between the semiconductor substrate and the second gate electrode, said manufacturing method comprising the steps of:
(a) providing a semiconductor substrate;
(b) forming a second insulating film for the second gate insulating film over a main surface of the semiconductor substrate;
(c) forming a second conductive film for the second gate electrode over the second insulating film;
(d) forming the second gate electrode by patterning the second conductive film;
(e) forming a first insulating film for the first gate insulating film over the main surface of the semiconductor substrate and a surface of the second gate electrode, said first insulating film including the charge storage portion therein;
(f) forming a first conductive film for the first gate electrode over the first insulating film; and
(g) forming the first gate electrode by leaving the first conductive film via the first insulating film over a sidewall of the second gate electrode by etching back the first conductive film, wherein the first insulating film includes a first silicon oxide film, a silicon nitride film over the first silicon oxide film, and a second silicon oxide film over the silicon nitride film, wherein the second silicon oxide film is interposed between the silicon nitride film and the first gate electrode, and
wherein metal elements are formed between the silicon nitride film and the second silicon oxide film such that the metal elements are in direct contact with the silicon nitride film and the second silicon oxide film.

2. The manufacturing method of the semiconductor device according to claim 1, wherein the step (e) comprises the steps of:
(e1) forming the first silicon oxide film over the main surface of the semiconductor substrate and a surface of the second gate electrode;
(e2) forming the silicon nitride film over the first silicon oxide film;
(e3) after the step (e2), depositing the metal elements over the silicon nitride film; and
(e4) after the step (e3), forming the second silicon oxide film over the silicon nitride film and the metal elements.

3. The manufacturing method of the semiconductor device according to claim 2, wherein in the step (e3), the metal elements are deposited by a sputtering method or ALD method.

4. The manufacturing method of the semiconductor device according to claim 3, wherein in the step (e3), the metal elements are deposited by the sputtering.

5. The manufacturing method of the semiconductor device according to claim 4, wherein in the step (e3), a plurality of metal dots comprised of the metal elements are formed between the silicon nitride film and the second silicon oxide film.

6. The manufacturing method of the semiconductor device according to claim 5, wherein the metal elements are comprised of titanium, nickel, tungsten, or tantalum.

7. The manufacturing method of the semiconductor device according to claim 6, wherein the metal elements are comprised of titanium.

8. The manufacturing method of the semiconductor device according to claim 1,
wherein the metal elements which are formed between the silicon nitride film and the second silicon have a surface density of $1\times10^{13}$ to $2\times10^{14}$ atoms/cm$^2$.

9. The manufacturing method of the semiconductor device according to claim 2,
wherein said step (e3) further comprises depositing the metal elements over the silicon nitride film at a surface density of $1\times10^{13}$ to $2\times10^{14}$ atoms/cm$^2$.

* * * * *